(12) United States Patent
Rivoir

(10) Patent No.: US 8,838,406 B2
(45) Date of Patent: Sep. 16, 2014

(54) RE-CONFIGURABLE TEST CIRCUIT, METHOD FOR OPERATING AN AUTOMATED TEST EQUIPMENT, APPARATUS, METHOD AND COMPUTER PROGRAM FOR SETTING UP AN AUTOMATED TEST EQUIPMENT

(75) Inventor: Jochen Rivoir, Magstadt (DE)

(73) Assignee: Advantest (Singapore) Pte Ltd, Singapore (SG)

( * ) Notice: Subject to any disclaimer, the term of this patent is extended or adjusted under 35 U.S.C. 154(b) by 412 days.

(21) Appl. No.: 13/128,705

(22) PCT Filed: Nov. 11, 2008

(86) PCT No.: PCT/EP2008/009509
§ 371 (c)(1),
(2), (4) Date: Jul. 25, 2011

(87) PCT Pub. No.: WO2010/054669
PCT Pub. Date: May 20, 2010

(65) Prior Publication Data
US 2011/0276302 A1  Nov. 10, 2011

(51) Int. Cl.
*G06F 19/00* (2011.01)
*G01R 31/319* (2006.01)
*G01R 31/3185* (2006.01)

(52) U.S. Cl.
CPC .... *G01R 31/31908* (2013.01); *G01R 31/31926* (2013.01); *G01R 31/318533* (2013.01)
USPC .......... 702/117; 714/724; 714/738; 324/73.1; 324/750.01

(58) Field of Classification Search
CPC .................. G01R 31/31908; G01R 31/31926; G01R 31/318533
USPC .......... 702/117; 714/700, 701, 724, 725, 731, 714/738; 324/73.1, 750.01, 754.1, 762.02
See application file for complete search history.

(56) References Cited

U.S. PATENT DOCUMENTS

| 4,001,818 A | 1/1977 | Radichel et al. |
| 4,629,889 A | 12/1986 | Todokoro et al. |

(Continued)

FOREIGN PATENT DOCUMENTS

| EP | 0747716 | 12/1996 |
| EP | 0859318 | 8/1998 |

(Continued)

OTHER PUBLICATIONS

Evans, A.C., "The New ATE: Protocol Aware", IEEE International Test Conference, Paper 20.1, Santa Clara, Oct. 2007.

*Primary Examiner* — Carol S Tsai

(57) ABSTRACT

A re-configurable test circuit for use in an automated test equipment includes a test circuit, a test processor and a programmable logic device. The pin electronics circuit is configured to interface the re-configurable test circuit with a DUT. The test processor includes a timing circuit configured to provide one or more adjustable-timing signals having adjustable timing. The programmable logic device is configured to implement a state machine, a state sequence of which depends on one or more input signals received from the pin electronics circuit, to provide an output signal, which depends on a current or previous state of the state machine, to the pin electronics circuit in response to the signal(s) received from the pin electronics circuit. The test processor is coupled to the programmable logic device to provide at least one of the adjustable-timing signal(s) to the programmable logic device to define timing of the programmable logic device.

49 Claims, 14 Drawing Sheets

(56) References Cited

U.S. PATENT DOCUMENTS

| | | | |
|---|---|---|---|
| 4,641,246 A | 2/1987 | Halbert et al. | |
| 5,025,205 A * | 6/1991 | Mydill et al. | 324/73.1 |
| 5,453,995 A | 9/1995 | Behrens | |
| 5,499,248 A | 3/1996 | Behrens et al. | |
| 6,639,529 B1 * | 10/2003 | Jansson | 341/120 |
| 6,678,645 B1 * | 1/2004 | Rajsuman et al. | 703/20 |
| 6,700,401 B2 | 3/2004 | Lapidus | |
| 6,937,006 B2 * | 8/2005 | West | 324/750.01 |
| 6,940,271 B2 * | 9/2005 | West | 324/750.01 |
| 7,017,091 B2 * | 3/2006 | West | 714/724 |
| 7,394,277 B2 | 7/2008 | Ishida et al. | |
| 7,406,638 B2 * | 7/2008 | Clark et al. | 714/724 |
| 7,412,342 B2 * | 8/2008 | Sturges et al. | 702/117 |
| 7,765,443 B1 * | 7/2010 | Syed et al. | 714/724 |
| 8,134,356 B2 | 3/2012 | Dobberpuhl et al. | |
| 8,269,520 B2 | 9/2012 | Conner | |
| 8,378,707 B2 | 2/2013 | Rivoir | |
| 8,432,181 B2 * | 4/2013 | Chiadambaram | 324/762.03 |
| 2002/0014451 A1 | 2/2002 | Janik et al. | |
| 2002/0140451 A1 | 10/2002 | Sakayori et al. | |
| 2002/0180477 A1 | 12/2002 | Inoshita et al. | |
| 2005/0024041 A1 * | 2/2005 | West | 324/158.1 |
| 2005/0060622 A1 * | 3/2005 | Clark et al. | 714/724 |
| 2005/0218919 A1 | 10/2005 | Yeh | |
| 2006/0100812 A1 * | 5/2006 | Sturges et al. | 702/117 |
| 2006/0170435 A1 * | 8/2006 | Granicher et al. | 324/754 |
| 2006/0236180 A1 * | 10/2006 | Ong | 714/731 |
| 2006/0242504 A1 * | 10/2006 | Kadota | 714/725 |
| 2007/0266288 A1 * | 11/2007 | Volkerink et al. | 714/738 |

FOREIGN PATENT DOCUMENTS

| | | |
|---|---|---|
| EP | 0864977 | 9/1998 |
| EP | 0882991 | 12/1998 |
| EP | 0886214 | 12/1998 |
| EP | 1092983 | 4/2001 |
| JP | 2001-324552 | 11/2001 |
| JP | 2003-149297 | 5/2003 |
| WO | 2010/054669 A1 | 5/2010 |

* cited by examiner

RE-CONFIGURABLE TEST CIRCUIT, METHOD FOR OPERATING AN AUTOMATED TEST EQUIPMENT, APPARATUS, METHOD AND COMPUTER PROGRAM FOR SETTING UP AN AUTOMATED TEST EQUIPMENT

BACKGROUND OF THE INVENTION

Embodiments according to the invention are related to a re-configurable nest circuit for use in an automated test equipment and to a method for operating an automated test equipment. Further embodiments according to the invention are related to an apparatus, a method and a computer program for setting up an automated test equipment.

Some embodiments according to the invention are related, to an automated test equipment (ATE) with programmable protocol behavior.

Testing of devices is an increasingly important aspect in the fabrication of complex devices like, for example, systems on a chip. With increasing complexity of the devices under test, a creation of appropriate test programs for testing such devices is getting more and more difficult. Also, further difficulties arise from the fact that more and more devices comprise the ability to establish, on their own initiative, a communication with other devices or external components, in accordance with a communication protocol. In some cases, it is extremely difficult to predict when a device will make an attempt to establish communication in accordance with a communication protocol. In addition, in some cases it may be extremely difficult to predict details regarding a timing of a communication which is established based on the initiative of a device.

Some of the above described developments impose increasing difficulties on the testing of such devices.

In the following, some details regarding conventional testers (or test systems), which may in the following be designated as automated test equipment (ATE), will be described. Traditional automated nest equipment output predetermined test vectors (i.e. a set of states across pins) and compare an input (for example a sequence of input values) to predetermined vectors.

In the following, a conventional automated test equipment will be described taking reference to FIG. 10. FIG. 10 shows a block schematic diagram of a conventional automated test equipment. The automated test equipment shown in FIG. 10 is designated in its entirety with 1000. The automated test equipment 1000 comprises a test processor (TP) 1010 and a pin electronics circuit (PE) 1030. Moreover, the automated test equipment 1000 comprises a memory 1040. The test processor 1010 may be configured to provide one or more output signals 1012 to the pin electronics circuit 1030. In some cases, the test processor may also be configured to provide an output clock signal 1014 to the pin electronics circuit 1030. The pin electronics circuit 1030 may, for example, comprise an output buffer or output driver 1032, which may be configured to receive the output signal 1012 and, optionally, the central signal or output clock signal 1014, from the test processor 1010. The output driver or output buffer 1032 may for example be configured to provide an output signal to a device-under-test (DUT) connection 1034 of the pin electronics circuit 1030. For example, the output buffer or output driver 1032 may be configured to receive the output signal 1012 of the test processor 1010, which output signal 1012 may, for example, be a digital signal, and to provide a device-under-test signal at the device-under-test connection 1034 on the basis of the output signal 1012, wherein the output buffer or output driver 1032 may translate the levels of the output signal 1012 to levels necessitated by the device-under-test. For example, the output buffer or output driver 1032 may be configured to receive the output signal 1012 having predetermined logic levels, and to provide a device-under-test output signal having adjustable (logic) levels. In addition, the DUT driver or the DUT buffer 1032 may be configured no amplify the output signal 1012 and/or to provide a predetermined output impedance.

The output buffer or output driver 1032 may further be configured to store or latch the output signal 1012 in the response to the optional control signal or clock signal 1014.

Additionally, the output buffer or output driver 1032 may be configured to be switched into a high-impedance state or "tristate"-state in response to the control signal 1014. For example, when signals are to be received from a device-under-test via the device-under-test connection 1034, it may be desirable to deactivate the output buffer or output driver 1032, for example by putting the output buffer or output driver 1032 into high-impedance state or "tristate"-state.

The test processor 1010 may further be configured to receive an input signal 1016 from the pin electronics circuit 1030. For example, the pin electronics circuit 1030 may comprise the input buffer or input threshold circuit 1036 in order to provide the received signal or input signal 1016 in dependence on a device-under-test signal, which may be present at the device-under-test connection 1034. For example, the receive buffer or threshold circuit 1036 may be configured to compare the device-under-test input signal, which may be provided by the device-under-test to the device-under-test connection 1034, with one or more threshold levels. Accordingly, the receive signal 1016 provided by the receive buffer or threshold circuit 1036 may indicate whether the device-under-test input signal is above or below one or more of the threshold levels.

In the following, some details regarding the test processor 1010 will be described. The test processor 1010 may, for example, comprise a data sequencer 1050. The data sequencer 1050 may, for example, be coupled to the memory 1040 to receive from the memory 1040 a description 1052 of a bit stream to be generated. The data sequencer 1050 may further be configured to provide a device-under-test stimulus bit stream 1054 on the basis of the information 1052. For example, the data sequencer 1050 may be configured to decompress a compressed description of the bit stream, which may be represented by the information 1052, to obtain the device-under-test stimulus bit stream 1054. In addition, the data sequencer 1050 may comprise additional functionality like, for example, a loop processing functionality or a repetition-language processing-functionality. The test processor 1010 may further comprise a drive formatter 1060, which drive formatter 1060 may, for example, be configured to generate the output signal 1012 in dependence on (or in response to) the device-under-test stimulus bit stream 1054. For example, the drive formatter 1060 may be configured to provide, as the output signal 1012, a wave form having an adjustable timing. For example, each bit of the device-under-test stimulus bit stream 1054 may be mapped to a waveform section having one or more edges with adjustable timing. Further, the drive formatter 1060 may, for example, be configured to provide the control signal 1014 in dependence on the device-under-test stimulus bit stream 1054 or in dependence on an additional side-information.

Moreover, the data sequencer 1050 may, for example, be configured to provide an expected device-under-test response bit stream 1056, which may, for example, describe a bit stream, which is expected as a response of the device-under-test to a signal pattern forwarded to the device-under-test.

The test processor 1000 may also comprise a receive formatter 1070, which receive formatter may be configured to sample the receive signal 1016 provided by the pin electronics circuit 1030, at adjustable instances in time. The receive formatter 1070 may, for example, be configured to provide a device-under-test response bit stream 1072 based on the input signal 1016. In other words, the receive formatter 1070 may convert the input signal 1016 into a sampled digital bit stream 1072, taking into account, for example, a timing or a physical level encoding of the received input signal 1016.

The test processor 1000 may further comprise an error processing 1080, which may be configured to receive the expected response bit stream 1056 from the data sequencer 1050 and the actual device-under-test (response) bit stream 1072 from the receive formatter 1070. The error processing 1080 may further be configured to compare the expected device-under-test response bit stream 1056 with the actual device-under-test response bit stream 1072, to determine whether the actual device-under-test response bit stream 1072 is in agreement with the expected device-under-test response bit stream 1056. If the actual device-under-test response bit stream deviates from the expected device-under-test bit stream 1056 (which may optionally comprise "don't cares"), the error processor 1080 may, for example, provide an error signal 1082.

The test processor 1000 may further comprise a timing generator 1090. The timing generator 1090 may, for example, comprise a clock generator 1092, which may be configured to generate a clock signal or to provide a clock signal on the basis of an externally provided clock signal. For example, the clock generator 1092 may receive a clock signal and derive a derived clock signal from the received clock signal. For example, the clock generator 1092 may comprise a phase locked loop or a delay locked loop in order to derive a clock signal 1092a. The timing generator 1090 may further comprise one or more delay lines 1094. The one or more delay lines 1094 may, for example, be configured to derive timing signals from the clock signal 1092a to adjust the timing of the drive formatter 1060 and of the receive formatter 1070. For example, a timing of edges of the output signal 1012 (or of the signal provided to the device-under-test at the device-under-test connection 1034) may be adjustable by varying a delay of one of the delay lines 1094. In addition, a time when the receive signal or input signal 1016 is sampled in the receive formatter 1070 is adjustable by varying a delay of one of the delay lines 1094. Accordingly, both a timing of the signal output to the device-under-test via the device-under-test connection 1034 and a timing of an evaluation of a signal received from a device-under-test via the device-under-test connection 1034 is adjustable using the timing generator 1090.

The test processor 1000 may further, optionally, comprise a time-interval-analyzer 1098. The time-interval-analyzer 1098 may, for example, be configured to determine a frequency of an input signal or a time between edges of the input signal 1016.

Furthermore, the test processor may comprise different communication means to communicate with an environment. For example, the test processor 1000 may comprise an interface to obtain data from the memory 1040 for a use in the data sequencer 1050. Moreover, the test processor 1000 may be configured to provide error data (or pass/fail data) to the memory 1040. The error data or pass/fail data may, for example, be obtained by the error processor 1080. In addition, the test processor may be coupled to one or more control lines to provide to the one or more control lines, for example, an error information 1082. For example, the one or more control lines may act as a wired-AND or as a wired-OR to couple the test processor 1000 with one or more additional test processors not shown in FIG. 10. For example, the test processor may provide the error information or the pass/fail, information 1082 to one or more of the control lines, for example to synchronize an operation of two or more test processors. Moreover, the data sequencer 1050 may be coupled to the one or more control lines, to be controlled by the one or more control lines.

Moreover, the test processor 1000 may comprise an interface 1099 for communication with a work station, or with any other means for providing control information to the test processor 1000.

To summarize the above, an example of a test processor for use in an automated test equipment has been described taking reference to FIG. 10.

Further aspects regarding test systems are described in some additional documents.

For example, US 2007/0266288 A1 describes an automated test system including one or more re-configurable test boards. Each test board includes at least one re-configurable test processor. The re-configurable test processors can communicate with one another using an inter-processor communication controller associated with each re-configurable test processor. The communication includes configuration information, control information, communication protocol information, stimulus data and responses. Configuration information and stimulus data can also be read from a memory. Configuration information is used to configure one or more re-configurable test processors. Once configured, the re-configurable test processor or processors process the data in order to generate one or more test signals. The one or more test signals are then used to test a device-under-test (DUT).

US 2006/0170435 A1 describes a programmable device to route signals on probe cards. A probe card of a waver test system includes one or more programmable integrated circuits (ICs) such as field-programmable-gate-arrays (FPGAs), to provide routing from individual test signal channels to one of multiple probes. The programmable integrated circuits can be placed on a base printed circuit board (PCB) of the probe card, or on a daughter card attached to the probe card. With programmability, the printed circuit board can be used to switch limited test system channels away from unused probes. Programmability further enables a single probe card to more effectively test devices having the same pad array, but having different pin-outs for different device options. Re-programmability also allows test engineers to re-program when debugging a test program.

US 2005/0024041 A1 describes a pin electronics interface circuit for use in an automated test equipment. The in electronics circuit includes a reconfigurable logic device in which different logic configurations may be installed to make measurements according to multiple tests to be applied to device-under-test. The pin electronics circuit comprises a level generating circuit coupled to the re-configurable logic device and configured to generate a number of test levels and a number of reference levels. The pin electronics circuit also comprises a switching circuit coupled to the re-configurable logic device and the level generating circuit, configured to receive the test levels and the reference levels, and controlled by the configurable logic device to selectively apply the test levels to the device-under-test according to a selected test, and to sense levels inputted to or outputted from the device-under-test by comparing the reference levels generated by the level generating circuit to the levels inputted to or outputted from the device-under-test.

The publication "The new ATE: protocol aware" of Andrew C. Evans (published: IEEE. International Test Conference, 2007. ITC 2007) describes an approach of a protocol-aware automated test equipment.

In view of the above discussion, there is a need for a cost efficient concept for providing a test circuit having a programmable protocol behavior and a good timing accuracy.

SUMMARY

According to an embodiment, a re-configurable test circuit for use in an automated test equipment may have: a test processor; a programmable logic device; and a pin electronics circuit configured to provide an interface between the re-configurable test circuit and a device-under-test; wherein the test processor has a timing circuit configured to provide one or more adjustable-timing signals having an adjustable timing; wherein the programmable logic device is configured to implement a state machine, a state sequence of which is dependent on one or more input signals received, via the pin electronics circuit; wherein the re-configurable test circuit is configured to acquire, using the programmable logic device, an output signal, which output signal is dependent on a current or previous, state of the state machine, and which output signal is indicative of a signal to be output by the pin electronics circuit, in response to the one or more input, signals received from the pin electronics circuit; and wherein the test processor is coupled to the programmable logic device and wherein the test processor is configured to adjust, using the one or more adjustable-timing signals, a timing used in a signal processing path, wherein the signal processing path has a path through the programmable logic device to provide the output signal in dependence on the one or more input signals.

According to another embodiment, a method for operating an automated test equipment may have the steps of: providing one or more adjustable-timing signals using a test processor; implementing, using a programmable logic device, a state machine, a state sequence of which is dependent on one or more signals received via a pin electronics circuit, to acquire, using the programmable logic device, an output signal, which output signal is dependent on a current or previous state of the state machine, in response to the one or more signals received via the pin electronics circuit; wherein a timing used in a signal processing, which signal processing is used to acquire the output signal, is adjusted in response to at least one of the one or more adjustable-timing signals.

According to another embodiment, an apparatus for setting up an automated test equipment, the automated test equipment having a configurable test processor, a programmable logic device and a pin electronics circuit may have: configure the test processor to provide one or more adjustable-timing signals having an adjustable timing; configure the programmable logic device to implement a state machine, a state sequence of which state machine is dependent on one or more input signals received via the pin electronics circuit, to acquire, using the programmable logic device, an output signal to be output via the pin electronics circuit in response to the one or more signals received via the pin electronics circuit, wherein the output signal is dependent on a current or previous state of the state machine; and configure the automated test equipment, such that a timing used in a signal processing, which signal processing is used to acquire the output signal, is adjusted in response to at least one of the one or more adjustable-timing signals.

According to another embodiment, a method for setting up an automated test equipment, the automated to equipment having a configurable test processor, a programmable logic device and a pin electronics circuit may have the steps of: configuring the programmable test processor to provide one or more adjustable-timing signals having an adjustable timing; and configuring the programmable logic device to implement a state machine, a state sequence of which state machine is dependent on one or more input signals received via a pin electronics circuit to acquire, using the programmable logic device, an output signal to be output via the pin electronics circuit in response to the one or more signals received via the pin electronics circuit, wherein the output signal is dependent on a current or previous state of the state machine; and wherein at least one of the adjustable-timing signals determines a timing used in a signal processing, which signal processing is used to generate the output signal.

Another embodiment may have a computer program for performing the method for operating an automated test equipment, which method may have the steps of: providing one or more adjustable-timing signals using a test processor; implementing, using a programmable logic device, a state machine, a state sequence of which is dependent on one or more signals received via a pin electronics circuit, to acquire, using the programmable logic device, an output signal, which output signal is dependent on a current or previous state of the state machine, in response to the one or more signals received via the pin electronics circuit; wherein a timing used in a signal processing, which signal processing is used to acquire the output signal, is adjusted in response to at least one of the one or more adjustable-timing signals, when the computer program runs on a computer.

Another embodiment may have a computer program for performing the method wherein the one or more adjustable timing signals are provided to the to the programmable logic device; wherein the state sequence of the state machine is dependent on one or more signals received from the pin electronics circuit by the programmable logic device; wherein the programmable logic device provides the output signal in response to the one or more signals received from the pin electronics circuit, such that the output signal is dependent on a current or previous state of the state machine; and wherein the a timing of the programmable logic device is determined using at least one of the one or more adjustable-timing signals, when the computer program runs on a computer.

Another embodiment may have a computer program for performing the method for setting up an automated test equipment, the automated test equipment having a configurable test processor, a programmable logic device and a pin electronics circuit, which method may have the steps of: configuring the programmable test processor to provide one or more adjustable-timing signals having an adjustable timing; and configuring the programmable logic device to implement a state machine, a state sequence of which state machine is dependent on one or more input signals received via a pin electronics circuit to acquire, using the programmable logic device, an output signal to be output via the pin electronics circuit in response to the one or more signals received via the pin electronics circuit, wherein the output signal is dependent on a current or previous state of the state machine; and wherein at least one of the adjustable-timing signals determines a timing used in a signal processing, which signal processing is used to generate the output signal, when the computer program runs on a computer.

Embodiments according to the invention create a re-configurable test circuit for use in an automated test equipment. The test circuit comprises a test processor, a programmable logic device and a pin electronics circuit configured so interface the re-configurable test circuit with a device-under-test.

The test processor comprises a timing circuit configured to provide one or more adjustable-timing signals having an adjustable timing. The programmable logic device is configured to implement a state machine, a state sequence of which is dependent on one or more input, signals received from the pin electronics circuit, to provide an output signal, which is dependent on a current or previous state of the state machine, so the pin electronics circuit, in response to the one or more signals received from the pin electronics circuit.

The test processor is coupled to the programmable logic device. The test processor is configured to adjust, using the one or more adjustable-timing signals, a timing used in a signal processing path, which signal processing path comprises a path through the programmable logic device to provide the output signal in dependence on the one or more input signals.

Alternatively, the test processor is coupled to the programmable logic device to provide at least one of the one or more adjustable-timing signals to the programmable logic device, to determine a timing of the programmable logic device.

Further embodiments according to the invention create a method for operating an automated test equipment. The method comprises providing one or more adjustable-timing signals to a programmable logic device using a test processor. The method also comprises implementing, using the programmable logic device, state machine, a state sequence of which is dependent on one or more signals received from the pin electronics circuit, to provide an output signal which is dependent on a current or previous state of the state machine in response so the one or more signals received from the pin electronics circuit. The method also comprises determining a timing of the programmable logic device using at least one of the one or more adjustable-timing signals.

Embodiments according to the invention provide an apparatus for setting up an automated test equipment, the automated test equipment comprising a configurable test processor, a programmable logic device and a pin electronics circuit. The apparatus for setting up the automated test equipment is adapted to configure the test processor to provide one or more adjustable-timing signals having an adjustable timing. The apparatus for setting up the automated test equipment is also adapted to configure the programmable logic device to implement a state machine, a state sequence of which is dependent on one or more input signals received from the pin electronics circuit, to provide an output signal, which is dependent on a current or previous state of the state machine, to the pin electronics circuit in response to the one or more signals received from the pin electronics circuit, wherein the test processor is configured to provide at least one of the adjustable-timing signals to the programmable logic device, to determine a timing of the programmable logic device.

Some embodiments according to the invention also create a method for setting up an automated test equipment. Some embodiments according to the invention create a computer program for performing the method.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
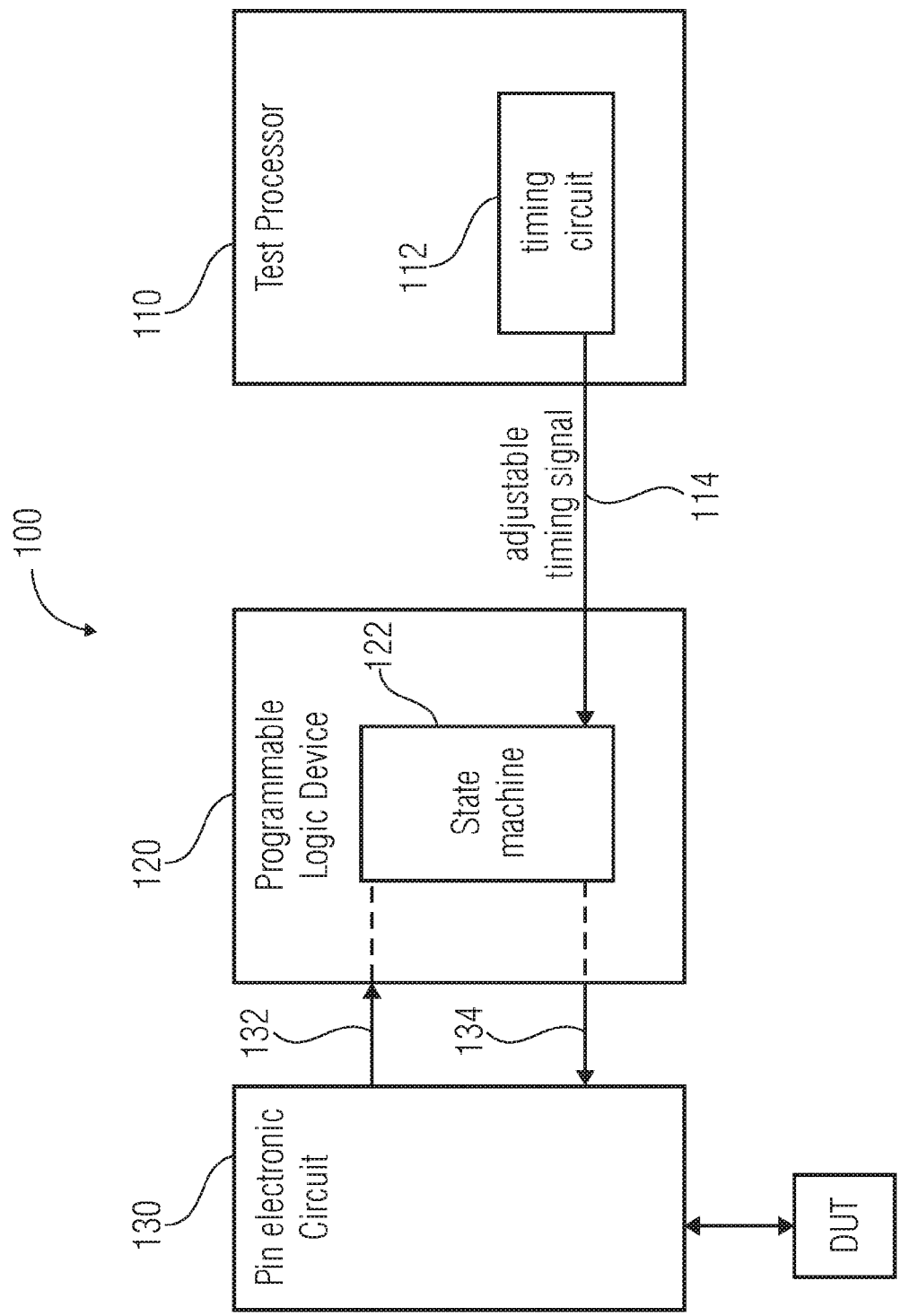
FIG. 1 shows a block schematic diagram of a re-configurable test circuit, according to an embodiment according to the invention.

FIG. 1 shows a block schematic diagram of a re-configurable test circuit, according to an embodiment according to the invention. The re-configurable test circuit shown in FIG. 1 is designated in an entirety with 100. The re-configurable test circuit 100 for use in an automated test equipment comprises a test processor 110, a programmable logic device 120 and a pin electronics circuit 130. The test processor 110 comprises a timing circuit 112, which is configured to provide an adjustable-timing signal 114 having an adjustable timing to the programmable logic device 120. The pin electronics circuit 130 is configured to interface the re-configurable test circuit with a device-under-test (DUT), which is not a part of the re-configurable test circuit 100. For example, the pin electronics circuit 130 is configured to provide one or more input signals 132 to the programmable logic device 120. The one or more input signals 132 may be dependent on signals received by the pin electronics circuit 130 from the device-under-test. The pin electronics circuit 130 is further configured to receive one or more output signals 134 from the programmable logic device 120 and to provide signals to the device-under-test based on the one or more output signals 134. The programmable logic device 120 is configured to implement a state machine 122, such that a state sequence of the state machine 122 is dependent on the one or more input signals 132 relieved from the pin electronics circuit. The programmable logic device 120 is also configured to provide one or more output signals 134, which are dependent on a current or previous state of the state machine, to the pin electronics circuit 130 in response to the one or more input signals 132 received from the pin electronics circuit. The test processor 110 is coupled to the programmable logic device 120 to provide at least one of the one or more adjustable-timing signals 114 to the programmable logic device 120 to determine (or to control) a timing of the programmable logic device 120.

Regarding the functionality of the above described re-configurable test circuit, the programmable logic device 120 allows for the implementation of a programmable protocol behavior. For example, the programmable logic device 120 may, in some embodiments, be reprogrammable, to be adjustable to implement different communication protocols for communication with a device-under-test. However, a timing of the programmable logic device 120, or of the state machine 122, may be determined by the test processor 110 using the adjustable-timing signal 114 provided by the test processor 110 to the programmable logic device 120. Thus, the timing accuracy provided by the test processor 110 can be used to achieve or improve a timing accuracy of the protocol behavior of the state machine 122. For example, the adjustable-timing signal 114 can be used to determine, when the state machine 122 samples one or more of the input signals 132 received from the pin electronics circuit 130, and/or when the state machine 122 performs a state transition and/or when the state machine 122 provides signal transitions or edges on the one or more output signals 134, which output signals are forwarded to the pin electronics circuit 130. In addition, the test processor 110, the timing circuit 112 of which may in some embodiments comprise a high accuracy timing generator, may determine an external timing behavior of the state machine 122, for example, a timing behavior with respect to the input signals 132 and/or the output signals 134) and/or an internal timing behavior of the state machine 122 (for example a timing of state transitions).

In an embodiment, the adjustable-timing signal 114 may optionally be re-used in different modes of operation. For example, the re-configurable test circuit 100 may be put into a protocol mode, in which the programmable logic device 120 generates the output signals 134 by providing a state machine behavior. In this mode of operation, the adjustable-timing signal 114 may serve to adjust a timing in of the state machine 122 and thus a timing of the protocol behavior. In a vector mode of operation, the adjustable-timing signal 114, which may, for example, represent a clock signal or a data signal, may be forwarded directly to the pin electronics circuit 134, avoiding the programmable logic device 120 or passing through the programmable logic device 120. Thus, the timing circuit 112 of the test processor 110 may serve, in the vector mode of operation, to immediately determine a timing of output signals provided to the device-under-test via the pin electronics circuit 130. Thus, allowing such a double-usage of the timing circuit 112 of the test processor, it is possible to implement the re-configurable test circuit 100 in a particularly cost efficient way while allowing an operation both in a protocol mode of operation and in a vector mode of operation.

The programmable logic device 120 is part of a signal processing path. For example, the signal processing path extends from the pin electronics circuit 130 to the programmable logic device 120 (to provide the input signals 132 to the programmable logic device 120), through the programmable logic device 120 (for example from an input of the state machine 122 to an output of the state machine 122) and back to the pin electronics circuit 130 (to provide the output signals 134 to the pin electronics circuit).

Accordingly, the adjustable timing signal 114 may generally be used to adjust a timing of the signal processing path. For this purpose, the adjustable-timing signal may for example act on the signal processing path at one or more different locations (for example at an input of the state machine 122, within the state machine 122, at an output of the state machine 122, or even before the input of the state machine 122 or after the output of the state machine 122).

Figure 2:
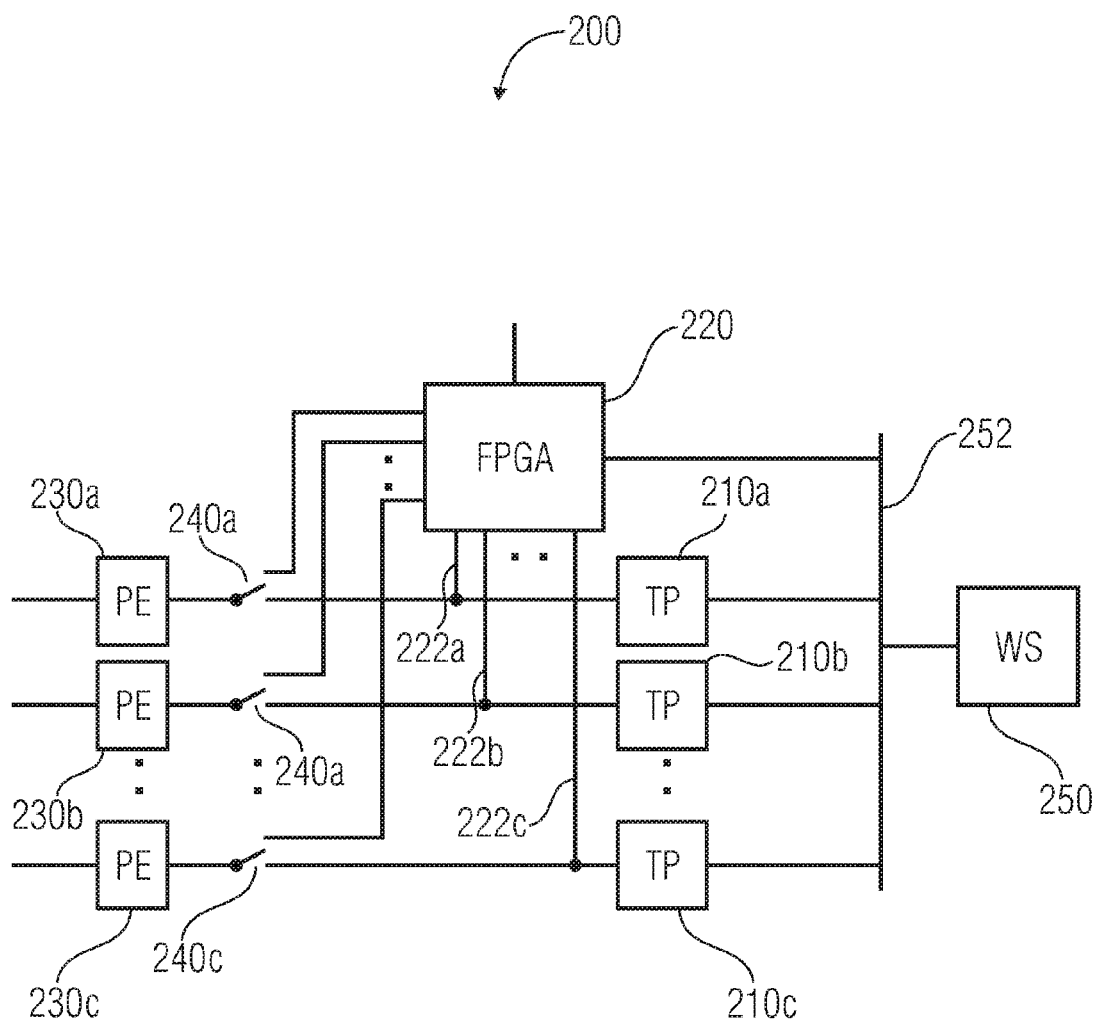
FIG. 2 shows a block schematic diagram of a re-configurable test circuit, according to another embodiment according to the invention.

In the following, further embodiments according to the invention will be described. FIG. 2 shows a block schematic diagram of a re-configurable test circuit, according to an embodiment. The re-configurable test circuit shown in FIG. 2 is designated in its entirety with 200. The re-configurable test circuit 200 comprises one or more test processors 210a to 210c. The re-configurable test circuit 200 also comprises a field-programmable-gate-array 220. A port (for example, an input or an output or an input/output) 222a of the field-programmable-gate-array 220 is coupled to a port (for example, an input or an output or an input/output) of the first test processor 210a. Optionally, further ports 222b, 222c of the field-programmable-gate-array 220 are coupled to ports of optional additional test processor 210b, 210c, as shown in FIG. 2. However, alternatively, multiple ports of the field-programmable-gate-array (FPGA) 220 may be coupled to ports of a single one of the test processors.

The re-configurable test circuit 200 may further comprise one or more pin electronics circuits 230a, 230b, 230c. The pin electronics circuits may, for example, be coupled to the FPGA 220 and/or to the one or more test processors 210a, 210b, 210c. For example, the re-configurable test circuit 200 may comprise one or more switches 240a, 240b, 210c circuited between the one or more pin electronics circuits 230a, 230b, 230c, the FPGA 220 and the one or more nest processors 210a, 210b, 210c. For example, first switch 240a may be circuited between the first pin electronics circuit 230a to selectively couple the first pin electronics circuit 230a with the FPGA 220 or the first test processor 210a. The selective coupling between, on the one hand, the pin electronics circuit 230a and, on the other hand, the field-programmable-gate-array 220 or the test processor 210a may be a unidirectional or a bidirectional coupling. In other words, in some embodiments for in some configurations) the first pin electronics circuit 230a may be configured to selectively provide an input signal to the FPGA 220 or the first test processor 210a. In another embodiment, or another configuration, the pin electronics circuit 230a may be configured to selectively receive an output signal from the FPGA 220 or from the test processor 210a. In another embodiment, or in another configuration, the pin electronics circuit 230a may selectively establish a bi-directional communication with the FPGA 220 or with the test processor 210a. In a further embodiment, or in a further configuration, the pin electronics circuit 230 may be configured to receive an output signal from the FPGA 220 and to provide an input signal to the test processor 210a or vice versa. Thus, different configurations are possible.

Similarly, corresponding signal connections can also be established, for example in a switchable or selective way, between the optional further pin electronics circuits 230b, 230c, the FPGA 220 and the optional further test processors 210b, 210c.

As already discussed above, the FPGA 220, which may, for example, take the place of the programmable logic device 120 described in respect to FIG. 1, may be configured to implement a state machine to emulate a data exchange protocol, to provide an output signal (to be forwarded to the device-under-test) on the basis of an input signal (received from the device-under-test, for example, via the pin electronics circuit). Moreover, the one or more test processors 210a to 210c may, for example, take over the functionality of the test processor 110 described with reference to FIG. 1, which may, in turn, for example, comprise the functionality of the test processor 1010 described with reference to FIG. 10. In other words, the test processors 210a to 210c may provide one or more signals comprising an adjustable-timing (also designated as adjustable-timing signals). The adjustable-timing signals may selectively, depending on the mode of operation, fulfill different purposes, as will be discussed in detail in the following.

The re-configurable test circuit 200 described with reference to FIG. 2 may, for example, be used to provide an automated test equipment (ATE) channel with an ability to switch between a vector mode (also designated with TP), wherein one or more test processors may determine a data pattern of signals exchanged with the device-under-test (for example, independently or on their own) in the vector mode, and a protocol mode (which may be designated, for example, with FPGA), wherein a field-programmable-gate-array may determine a data pattern exchanged with the device-under-test by emulating a data exchange protocol.

In the protocol mode, the one or more test processors 210a to 210c may exchange optional timing information, trigger information, control information or data information, as will be described in detail below.

In the re-configurable test circuit 200, the one or more test processors 210a to 210c and the field-programmable-gate-array 220 may be coupled to a work station 250, for example using a common communication bus 252. Thus, there is the possibility to re-configure the one or more test processors 210a to 220c and/or the FPGA 220 using the work station 250. In addition, there may be a possibility to read out test results provided by the one or more test processors 210a to 210c and/or by the field-programmable-gate-array 220. However, many different possibilities exist to establish such a link. It is not required that there is a direct link between the work station and the test processors and/or field-programmable-gate-array 220. Rather, the link can comprise one or more indirect communication means, for example a dual-ported random access memory, or the like. Additionally, different types of interfaces can be implemented between the work station and test processors and/or the field-programmable-gate-array 220.

In addition, it is not necessary that the work station 250 can communicate directly with the field-programmable-gate-array 220. Rather, it is possible that the work station may, for example, only be capable of communicating with the field-programmable-gate-array 220 via, one or more of the test processors 210a to 210c, as will be described below.

Figure 3:
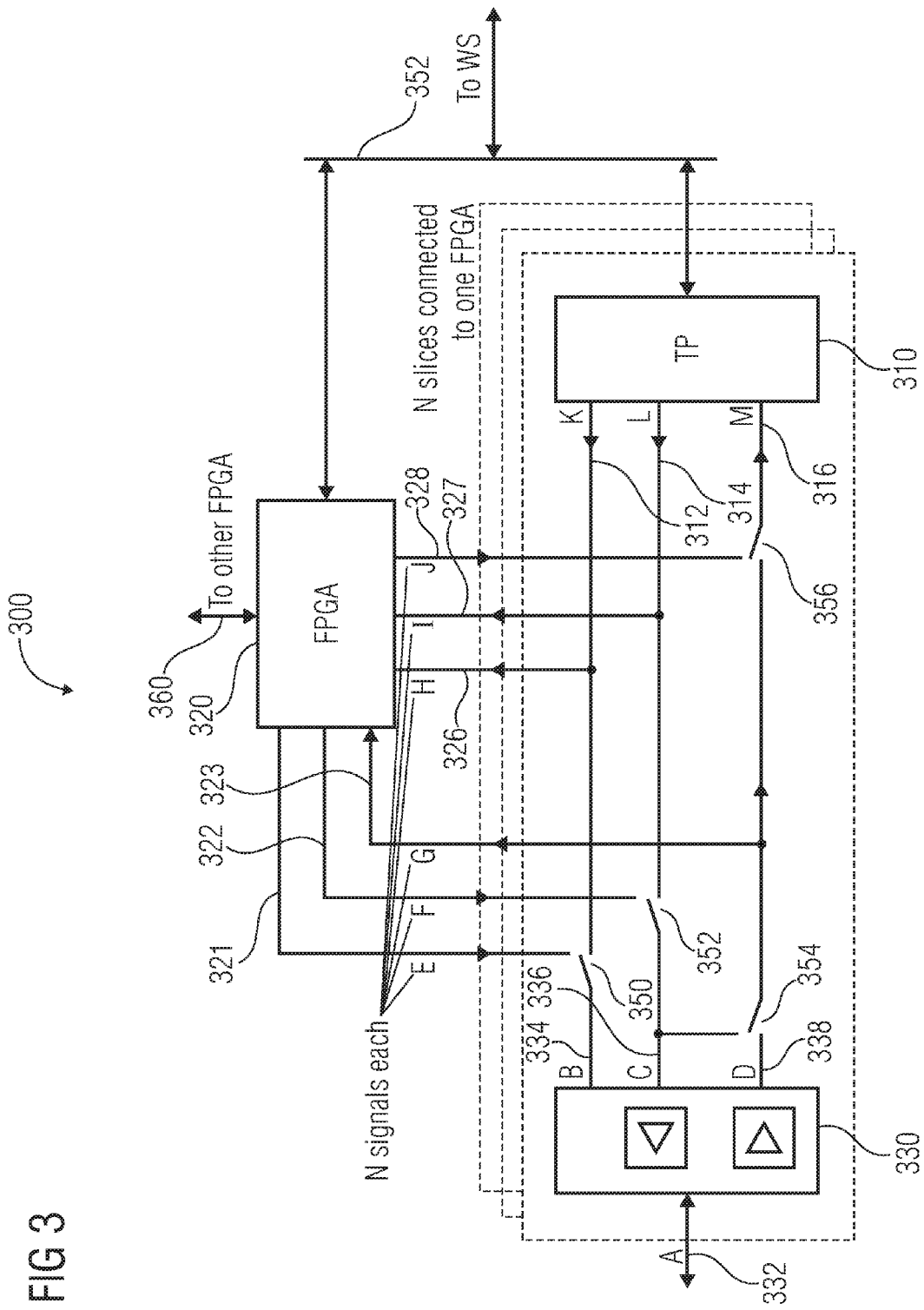
FIG. 3 shows a block schematic diagram of a re-configurable test circuit, according to another embodiment, according to the invention.

Taking reference now to FIG. 3, a concept will be described for switching between the FPGA and the test processor, for example, to switch between a protocol mode of operation and a vector mode of operation. FIG. 3 shows a block schematic diagram of a re-configurable test circuit, according to another embodiment according to the invention. The re-configurable test circuit shown in FIG. 3 is designated in its entirety with 300. The re-configurable test circuit 300 comprises a test processor 310, which may comprise the functionality of the one or more test processors 210a to 210c, of the test processor 110 or of the test processor 1010. The re-configurable test circuit 300 further comprises a field-programmable-gate-array 320, which may comprise the functionality of the field-programmable-gate-array 220 or of the programmable logic device 120. The re-configurable test circuit 300 may further comprise a pin electronics circuit 330, which may, for example, comprise the functionality of the pin electronics circuit 230a to 230c, of the pin electronics circuit 130 or of the pin electronics circuit 1030.

The test processor 310 may, for example, comprise a first port 312, which may be configured (e.g. programmed, or hard-wired to act as an output. The first port 312 of the nest processor is also designated with "K". The test processor 310 may also comprise a second port 314, which is configured to operate as another output. The second port 314 is also designated with "L". The test processor 310 may also comprise a third port 316 ("M"), which is configured to operate as an input. For example, the output 312 ("K") may be configured to provide an output signal with an adjustable data pattern and an adjustable-timing. Alternatively, the output K may be configured to provide a signal with a fixed data pattern in an adjustable-timing, for example a clock, signal with an adjustable-timing. For example, the output K of the test processor 310 may be configured to perform the functionality of the output D of the test processor 1010 shown in FIG. 10. Similarly, the output 314 ("L") may be configured to have the functionality as described for the output K.

The input M of the test processor 310 may, for example, be configured to receive an input signal and to extract a data content of the input signal. For example, the input K of the test processor 310 may be configured to perform the functionality of the input R of the test processor 1010.

In other words, the input K of the test processor 310 may be configured to sample an input signal with an adjustable sample timing (for example using a receive formatter) to obtain a sampled bit stream. Further, the test processor may be configured to compare the sampled bit stream obtained from the input K with a reference bit stream and/or to capture the sampled bit stream or a portion thereof.

The pin electronics circuit 330 may, for example, comprise a device-under-test connection 332. The device-under-test connection 332, which may also be designated with "A", may comprise one or more connections (for example, electrical or optical connections). The device-under-test connection 332 may, for example, be configured to establish a bidirectional communication between the device-under-test and the pin electronics circuit 330. The pin electronics circuit 330 may comprise an input 334, which may also be designated with "B". For example, the pin electronics circuit 330 may be configured to provide a signal to the device-under-test via the device-under-test connection 332 in response to the input signal at the input 334. Moreover, the pin electronics circuit 330 may optionally comprise a second input 336 ("L"), which may be configured to receive anther input signal. The pin electronics circuit may be configured to provide a signal to the device-under-test via the device-under-test connection 332 on the basis of the signal from the second input 336. Moreover, the pin electronics circuit 330 may comprise an output 338 ("D"). The pin electronics circuit may be configured to provide a signal at the output 338 in response to a signal received from the device-under-test via the device-under-test connection 332. The pin electronics circuit may, for example, be configured to forward the input signals 334, 336 to the device-under-test connection 332 without substantially changing the bit pattern. However, the pin electronics circuit may naturally determine levels (or a physical encoding) of the data streams input to the pin electronics circuit via the inputs 334, 336. In addition, the pin electronics circuit 330 may provide the signal at the output 338 for example by comparing a signal received via the device-under-test connection 332 with one or more threshold levels. The pin electronics circuit 330 may, for example, comprise the same functionality as the pin electronics circuit 1030 described with reference to FIG. 10.

The field-programmable-gate-array 320 comprises, for example, a first device-under-test output 321 (also designated with "E") and a second device-under-test output 322 (also designated with "F"). In addition, the FPGA 320 comprises a device-under-test input 323 (also designated with "G"). The FPGA 320 also comprises, for example, a first test processor input 326 (also designated with "H"), a second test processor input 327 (also designated with "I") and a test processor output 328 (also designated with "J").

The first input 334 of the pin electronics circuit 330 is, for example, selectively connectable, for example via a first switch 350, with the first DUT output 321 of the FPGA 320 or with the first output 312 of the test processor. The second input 336 of the pin electronics circuit 330 is selectively connectable, for example, via the switch 352, with the second DUT output 322 of the FPGA 320, or with the second output 314 of the test processor 310. The input 316 of the test processor 310 is, for example, selectively connectable with the output 338 of the pin electronics circuit 330 (to receive a signal provided by the device-under-test via the pin electronics circuit 330), with one of the inputs 334, 336 of the pin electronics circuit 330 (to evaluate a timing or a data content of a signal present at the respective input of the pin electronics circuit 330) or with the test processor output 328 of the FPGA 320. For example, a switch 354 may be provided to selectively couple the output 338 of the pin electronics circuit 330, or one of the inputs 334, 336 of the pin electronics circuit 330, with the device-under-test input 323 of the FPGA 320. Moreover, the a 356 may be provided to selectively connect a common pole of switch 354 (which common pole is coupled to the device-under-test input 323 of the FPGA 320) or the test processor output 328 of the FPGA 320 with the input 316 of the test processor 310.

The second output 314 of the test processor 310, the second input 336 of the pin electronics circuit 330 and the second device-under-test input 327 of the FPGA 320 should be considered optional. In addition, other configurations of the switches 350, 352, 354, 356 can be chosen, if desired.

Moreover, the test processor 310 and/or the FPGA 320 may be coupled with a control means, for example a work station WS, for example by a common link 352. Additionally, a plurality of sets comprising a test processor and a pin electronics circuit may be provided, which sets may, for example, be designated as "slices". A plurality of, for example, "N" slices may be connected to a single field-programmable-gate-array 320. In other words, the re-configurable test circuit 300 may optionally comprise a plurality of test processors 310 and a plurality of corresponding pin electronics circuits 330. For example, "N" sets may be used. "N" such sets or "slices" may be connected to the FPGA 320. Accordingly, the signals provided at the inputs 323, 326, 327 of the FPGA 320 and/or the signals provided at the outputs 321, 322, 328 of the FPGA 320 may comprise "N" signals each. For example, the output 321 may comprise "N" signals and the output 322 may also comprise "N" signals. The input 323 may comprise "N" signals, and so on.

Moreover, in an another embodiment, the FPGA 320 may be coupled, for example via an FPGA-to-FPGA interface 360 with one or more additional FPGAs.

In the following, the several possibilities for switching between the FPGA and the test processor (TP) will be described taking reference to FIG. 3.

Firstly, different physical concepts for switching between the FPGA and the test processor TP will be described. Subsequently, details regarding the overall system operation in the different modes (vector mode of operation and protocol mode of operation) will be described.

The switching between the FPGA and the test processor TP may, for example, be performed by means of one or more relays or one or more semiconductor switches. The switching may also be performed by means of one or more XOR operations, wherein one branch is static. Switching can also be performed by means of one or more OR operations, wherein one branch is "0". Switching can alternatively be performed by means of one or more AND operation, wherein one branch is "1". The switching may alternatively also be performed making use of a three-state-combining.

To summarize the above, there is a plurality of different concepts for selecting the signal path, i.e. to implement the functionality the switches 350 to 356 shown in FIG. 3, or to decide how to route the signals provided by the test processor (for example at outputs K,L), how to route the signals provided by the FPGA (for example at the outputs E, F) and/or how to route signals provided at the output D of the pin electronics circuit 330.

In the following, the functionality in the vector mode of operation will be briefly described. In the vector mode of operation, the field-programmable-gate-array 1020 may be inactive in that a data pattern, which is output to the device-under-test is determined by the test processor 310 (for example, independently). In other words, a data pattern as generated by the drive formatter 1060 of the test processor 310 may be output, in an un-modified form with respect to a data content, by the pin electronics circuit 330 to the device-under-test connection 332. In this case, the field-programmable-gate-array 320 may be ineffective with respect to the data pattern or with respect to a data content of the data pattern. However, in some embodiments, the field-programmable-gate-array 320 may act as a routing resource, but without a capability to modify a data content or a data format (for example, a frame-format) of the data pattern provided by the test processor 310. In addition, in the vector mode of operation, the test processor 310 may directly receive a data pattern as provided by the pin electronics circuit 330 without any substantial modifications. In other words, in the vector mode of operation, the FPGA 320 may be inactive with respect to the data pattern provided by the pin electronics circuit, or may act as a routing resource. However, in the vector mode of operation, the FPGA 320 does not modify a data format (for example, a frame format) and/or a data content of the data provided by the pin electronics circuit 330 to the test processor 310. In some embodiments, the pin electronics circuit may even be coupled directly, avoiding the FPGA 320, with the test processor. For example, in the vector mode of operation the switch 350 may provide for a direct routing of a signal from the output "K" of the test processor 310 to the input "B" of the pin electronics circuit 330. Moreover, the switches 354, 356 may provide for a direct routing of a signal from the output "D" of the pin electronics circuit 330 to the input "M" of the test processor 310, avoiding the field-programmable-gate-array.

To summarize the above, in the vector mode of operation the test processor has full control over the data to be output to the device-under-test, and also has full control in evaluating the data received from the device-under-test. The drive formatter 1060 may, for example, determine, in the vector mode of operation, a timing of the data pattern to be output to the device-under-test, and the receive formatter 1070 of the test processor 310 may determine a timing of an evaluation of the data pattern received from the device-under-test.

In the following, the operation of the re-configurable test circuit 300 in the protocol mode of operation will be described.

In the protocol mode of operation, the field-programmable-gate-array 320 (or the field-programmable-gate-array 220, or the programmable logic device 120) may perform one or more of the following functions:

Generate transactions as a master or accept transactions as a slave. An instruction may come from the test processor 310, for example from the output "K" of the test processor 310 to the input "H" of the FPGA 320, and/or from the output "L" of the test processor 310 to the input "I" of the FPGA 320 (K→H, L→I). Read data or status may be fed to the test processor 310, for example, from the output "J" of the FPGA 320 to the input "M" of the test processor 310 (J→M).

Emulate a device behavior, e.g. of a memory.

Check protocol (for example to generate a trigger when one or more protocol rules are violated)

State tracking, for example observe protocol and output state.

Detect a condition, for example a user specified condition, for example as a trigger for a debugging.

Measure performance, for example a percentage of a bus utilization.

In some embodiments, the FPGA 320 and the test processor 310 may be coupled. One or more signals may be provided from the test processor 310 to the FPGA 320. For example, the output "K" of the test processor 310 may be coupled the input "H" of the FPGA 320. In addition, the output "L" of the test processor 310 may be coupled to the input "I" of the FPGA 320. Similarly, one or more signals may be provided from the FPGA 320 to the test processor 310. For example, the output "J" of the FPGA 320 may be coupled to the input "M" of the test processor 310.

In the following, a possible use for signal between the FPGA 320 and the test processor 310 will be described.

Signals provided from the test processor 310 to the FPGA 320 (for example K→H) can be used, for example, for one or more of the following purposes:

Timing edge for programmable timing of FPGA outputs "E" or "F", or programmable capture timing at the FPGA input "G".

Trigger, for example start/stop/next master transaction, reset.

Control, for example change behavior, for example number of waits (or a wait states), change state, for example exception.

Data, for example master transaction address (addr)/command (cmd)/data/attributes, target data/attributes.

Signals provided from the FPGA 320 to the test processor 310 (for example J→M) may be used for one or more of the following purposes:

Measure FPGA output timing (F→C→D→M).

Trigger, for example protocol violation or user defined condition, for example to freeze capture for debug or start action or inform work station.

Control, for example extract protocol information for capture or analysis or reaction in test processor.

Data, for example master read data for capture in test processor or target write data for capture in test processor, or performance measures.

To summarize the above, the test processor may, in some embodiments, adjust the behavior of the field-programmable-gate-array 320, while the field-programmable-gate-array operates in a protocol mode to either realize a state machine, state transitions of which are executed in response to one or more signals receive from the device-under-test. For example, the test processor may adjust, using, for example, its drive formatter 1060 and its timing generator 1090, a timing of the state machine, which state machine is implemented using the field-programmable-gate-array. For example, the state machine may comprise one or more clocked circuits, for example registers and/or latches. Moreover, the state machine may be configured to sample the input signal provided by the device-under-test at certain instances in time. The sampling instances in time may, for example, be determined making use of a signal provided to the FPGA by the test processor. Moreover, an output signal which may be provided to the device-under-test by the state machine implemented using the field-programmable-gate-array may be latched in the field-programmable-gate-array, such that edges of the output signal of the state machine, which are forwarded to the device-under-test, occur at a selectable time. The timing of that edges may for example adjusted using a signal provided to the FPGA by the test processor.

Thus, the test processor may directly affect a timing of the state machine implemented using the FPGA by determining a clock of the state machine (or of an input sampling circuit thereof, or of an output latching circuit thereof).

In some embodiments, a signal provided from the test processor to the FPGA may optionally be used to trigger the state machine implemented using the FPGA. For example, the test processor may provide a signal which initiates or interrupts a data communication from the field-programmable-gate-array to the device-under-test, or vice-versa. Thus, the FPGA may determine, for example using a high timing resolution (which may be obtained by the usage of the timing generator 1090), a timing of the communication. For example, the trigger signal provided by the test processor may act directly to determine which state transition is performed in the state machine implemented using the field-programmable-gate-array, for example, independent from any signals provided to the state machine by the device-under-test. For example, the trigger signal provided by the test processor may trigger a state transition in the FPGA. Thus, in addition to an optimal fine tuning of a clock of the finite state machine, a signal provided to the finite state machine by the test processor may, for example, be used to decide, with a high temporal resolution, in which clock cycle of the state machine a certain transition (for example, from a wait-state to a communication state) is to be performed. For example, the test processor may determine, using a signal communicated from the test processor to the field-programmable-gate-array (or the state machine implemented therein), in which clock cycle of the state machine a communication from the FPGA to the device-under-test is initiated, for example in a mode in which the state machine implemented using the field-programmable-gate-array acts as a communication master device (and in which the device-under-test may act as a communication slave device). Thus, the test processor may, for example, coordinate, with high temporal resolution, a protocol-based communication (which is substantially controlled, once it is triggered, by the state machine) with other signals provided to the device-under-test using the data sequencer 50.

Further, the test processor may optionally communicate control signals to the field-programmable-gate-array, for example, to determine a configuration of the state machine or to change a sequence of states. Such control signals may also be provided to the FPGA using the high temporal resolution of the test processor.

Further, in some embodiments, the test processor may optionally forward to the FPGA data, which are to be communicated to the device-under-test using the state machine implemented within the FPGA. For example, the FPGA may receive data (for example address data, command data, general data or attribute data) and transmit said data to a device-under-test in accordance with a communication protocol, wherein the communication protocol comprises a plurality of state transitions, which are implemented using the state machine. For example, the state machine implemented using the FPGA may embed the data received from the test processor into a communication frame. Thus, the state machine of the FPGA may, for example, be used to implement one or more of the lower OSI protocol layers, for example a data link layer, as defined by the international organization for standardization (ISO), and embed the data provided by the test processor into a generated bit stream.

Again, the test processor may additionally determine, with a high temporal resolution, when said data are transmitted.

Regarding an evaluation of a data communication between the device-under-test and the state machine implemented using the FPGA, the test processor can fulfill different functionalities. For example, the test processor can, for example, be used to measure a timing of an output signal provided by the FPGA. Accordingly, the test processor can, for example, decide whether the timing provided by the FPGA is within tolerable limits. The timing of the signal provided, by the FPGA can be affected by different factors. For example, a timing of a signal provided by the FPGA can be affected by a timing of one or more signals provided to the FPGA by the test processor. For example, the test processor can provide to the FPGA a signal adjusting the timing of the state machine implemented using the FPGA. By measuring the timing of an output signal provided by the FPGA, the test processor may, for example, evaluate a propagation delay within the FPGA. Accordingly, the test processor can adjust the timing of the signal provided to the FPGA (for adjusting the timing) such that a timing of a signal output by the FPGA fulfills the requirements (lies within a predetermined range). Thus, the test processor can be used to calibrate the timing of the FPGA.

Moreover, in some other embodiments, the timing of the signal provided by the FPGA may be dominated by a timing of a signal received by the FPGA from the device-under-test. For example, there may be a predetermined time relationship between a signal received by the FPGA from the device-under-test and a signal provided by the FPGA to the test processor in response to the device-under-test signal. Accordingly, by measuring the timing of the signal provided from the FPGA to the test processor, the test processor can determine or measure (on the basis of a knowledge about the functionality of the state machine) a timing of the signal from the device-under-test. Accordingly, the test processor can indirectly determine or measure or verify a timing of the signal provided by the device-under-test. In other words, the signal provided by the device-under-test is processed by the state machine implemented using the FPGA. In response to this state-machine-processing (which may comprise processing in accordance with a communication protocol), a response signal is generated, which may, for example, indicate a predetermined condition in the communication protocol (for example a completion of a data transport, the occurrence of an error, and so on). Consequently, a signal indicating the predetermined condition in the communication or in the communication protocol may be forwarded to the test processor, such that the test processor can evaluate, with a high timing resolution, when the predetermined condition is reached.

Furthermore, in some embodiments, the FPGA may optionally implement the state machine to evaluate the communication protocol. In this case, the FPGA may provide a signal to the test processor signalizing the predetermined condition in the communication protocol. For example, the FPGA may indicate, via a signal provided to the test processor, when a protocol violation occurs or when a user-defined condition within a communication protocol (for example, a predetermined state of the state machine) occurs. The test processor may, for example, optionally react to such a trigger condition, signalized by the FPGA using an evaluation of the communication protocol in its state machine, by initiating or stopping a capture of data (which capture of data may, for example, be performed using the receive formatter 1070, and, optionally, the error processing 1080).

Further action may optionally be taken in the test processor in response to the FPGA signalizing the occurrence of a user-defined condition.

The FPGA may further, in some embodiments, optionally communicate data to the test processor. In some embodiments, the FPGA may communicate user-data transported in accordance with a communication protocol to the test processor for evaluation or capture in the test processor. Alternatively, the test processor may extract some control data from a signal received from the device-under-test and forward such extracted control information to the test processor for capture and/or evaluation.

To summarize the above, significant benefit can optionally be taken in some embodiments from a cooperation of the FPGA with the test processor. While the FPGA may, for example, take over the implementation of a communication protocol, the test processor may be used to adjust a timing of a state machine implemented using the FPGA, for example by providing a clock signal and/or data signals and/or trigger signals having a precisely adjustable timing. Further, the test processor may evaluate, with high-timing transition, signals provided by the FPGA, as described above.

Figure 4:
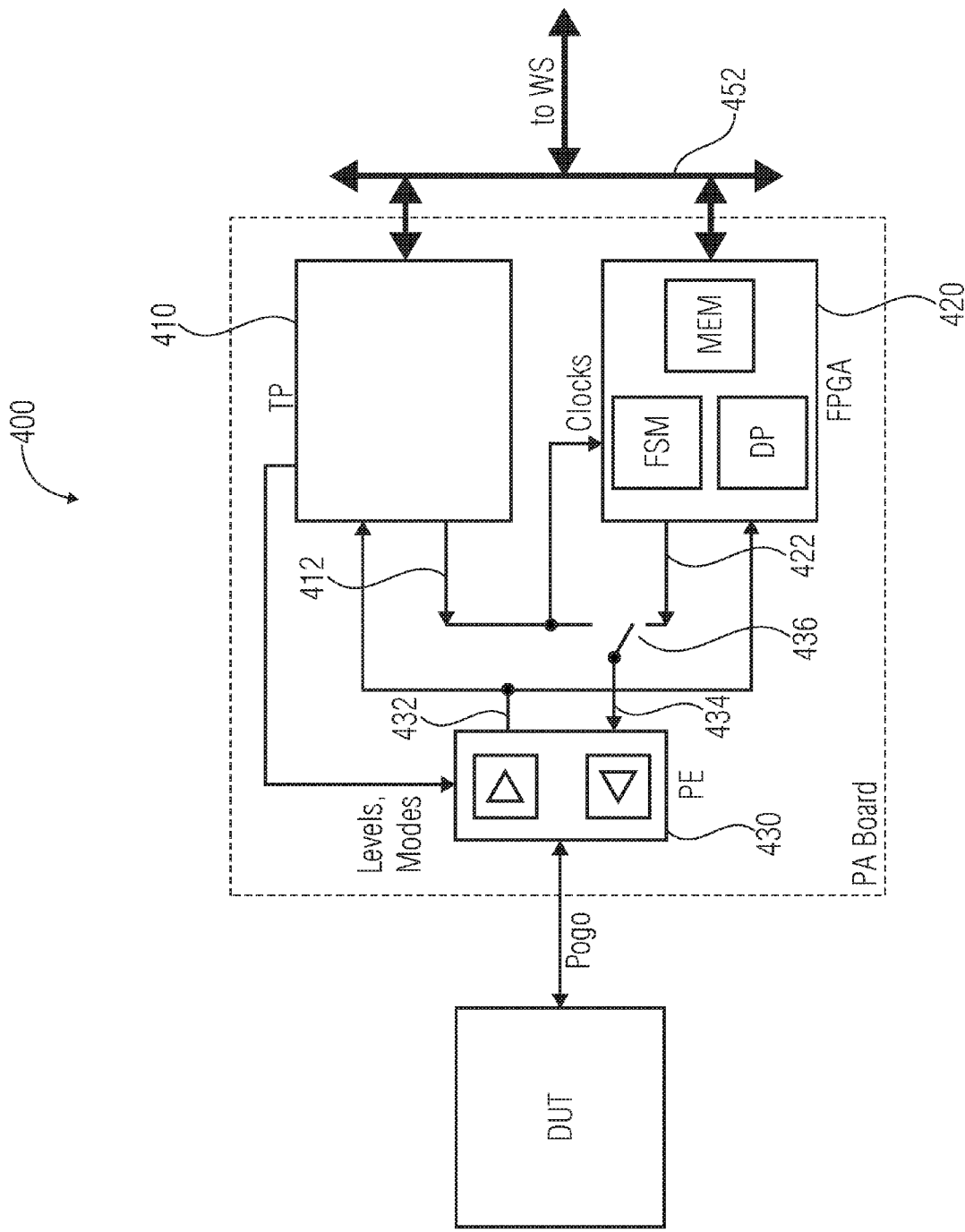
FIG. 4 shows a block schematic diagram of a re-configurable test circuit, according to another embodiment according to the invention.

In the following, another embodiment according to the invention will be described taking reference to FIG. 4. FIG. 4 shows a block schematic diagram of a re-configurable test circuit according to an embodiment. The re-configurable test circuit shown in FIG. 4 is designated in its entirety with 400. The re-configurable test circuit 400 comprises a test processor 410, which may comprise the functionality of the test processors 110, 210, 310a to 310c, 1010. The re-configurable test circuit 400 also comprises a field-programmable-gate-array 420, which may comprise the functionality of the programmable logic device or field-programmable-gate-array 120, 220, 320. The re-configurable test circuit 400 also comprises a pin electronics circuit 430, which may comprise the functionality of the pin electronics circuit 130, 230, 330, 1030. Moreover, a device-under-test (DUT), which is not part of the re-configurable test circuit 400, may be connected to the re-configurable test circuit 400, for example using a pogo-connection. In other words, the device-under-test (DUT) may, for example, be arranged on a test board, which is connected to the re-configurable test circuit 400 via a pogo pin and/or an additional connection (for example a cable). However, other types of connections between the re-configurable test circuit 400 and the device-under-test are naturally possible, as it is well known from the field of testing.

The test processor 410 may, for example, be coupled to the pin electronics circuit 430 to control levels and/or modes of the pin electronics circuit 430. For example, the test processor may determine the levels of signals output by the pin electronics circuit 430 to the device-under-test. In addition, the test processor may determine threshold levels, with which signals input to the pin electronics circuit 430 from the device-under-test are compared.

An output 432 of the pin electronics circuit 430 may be coupled, for example, both to the test processor 410 and to the FPGA 420, such that both the test processor 110 and the FPGA 420 can receive a signal, which is input to the pin electronics circuit 430 from the device-under-test. Moreover, an input 434 of the pin electronics circuit is selectively connectable to an output 412 of the test processor or to an output 422 of the FPGA 420. For example, a switch 436 may be used to affect this selective connection. Moreover, the output 412 of the test processor 410 may be connected to a clock input of the field-programmable-gate-array 420. The output 412 of the test processor 410 may, for example, comprise the functionality of the output 1012 of the test processor 1010, as described in detail above.

For example, the field-programmable-gate-array 420 may be configured to implement a finite state machine (FSM), for example, to generate the output signal at the output 422 in accordance with a communication protocol of the device-under-test. Moreover, the finite state machine may, for example, be configured to react to a signal provided by the device-under-test and forwarded to the FPGA via the pin electronics circuit 430 (for example, via the output 432 thereof). Moreover, the FPGA 420 may optionally be configured to perform a data processing (DP). Moreover, the FPGA 420 may optionally be configured to implement a memory (MEM). Regarding the functionality of the re-configurable test circuit 400, reference is made to the description of the re-configurable test circuit 100, 200, 300. In addition, regarding the functionality of the test processor 410, reference is made to the above description, and also the description of the test processor 1010.

The test processor 410 and the FPGA may, for example, be connected to a work station via a common link 452, as indicated in FIG. 4.

Figure 5:
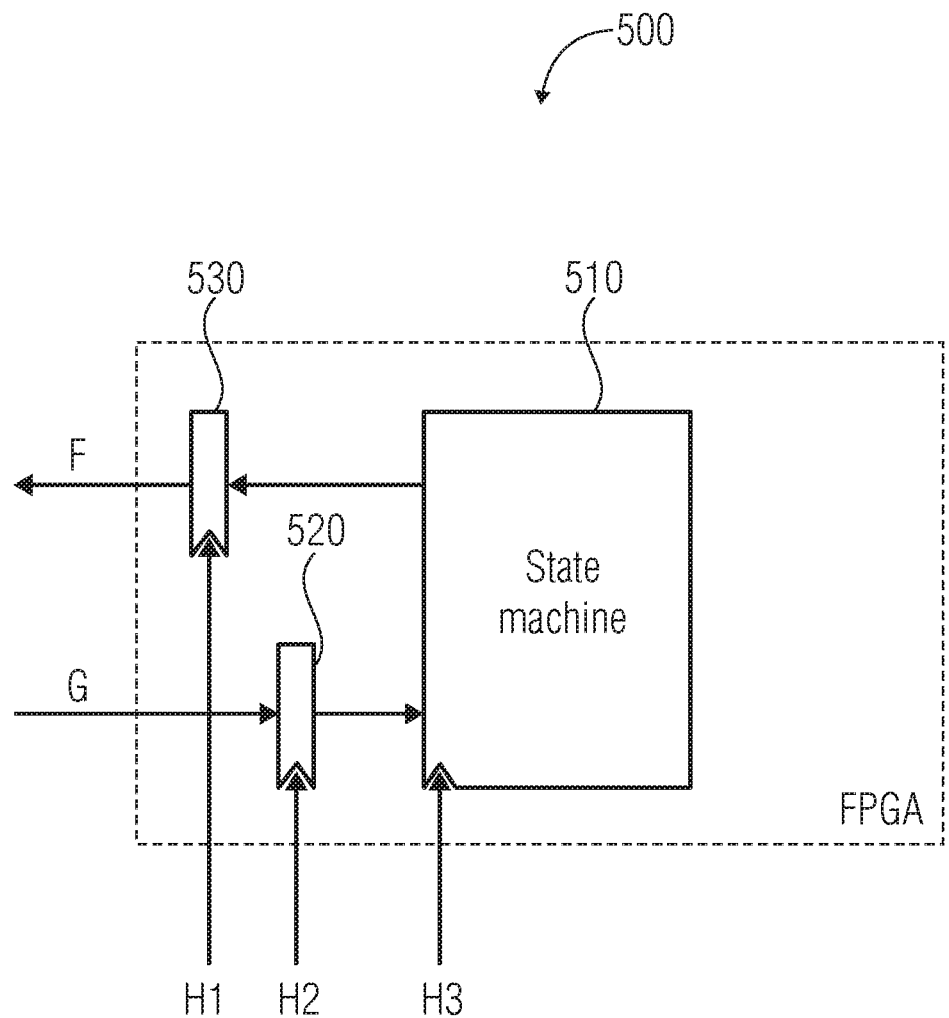
FIG. 5 shows a block schematic diagram of a possible implementation of a state machine in a field programmable gate array.

In the following, some details regarding the functionality of the FPGA will be described taking reference to FIG. 5. FIG. 5 shows a block, schematic diagram of a field-programmable-gate-array, which may be used to implement the functionality described above. The field-programmable-gate-array shown in FIG. 5 is designated in its entirety with 500. The field-programmable-gate-array 500 comprises (or is configured to implement) a state machine 510. The field-programmable-gate-array 500 further comprises an input latch or input register 520, which may or may not be part of the state machine 510. In addition, the field-programmable-gate-array 500 may comprise an output latch or an output register 530, which may or may not be part of the state machine 510. Thus, the state machine 510 may be configured to receive, via the input latch or the input register 520, an input signal from the device-under-test, for example, via the input, signal G. Moreover, the state machine 510 may be configured to provide, via the output latch or the output register 530, a signal to the device-under-test, for example via the output F.

The output latch or output register 530 may be clocked by a clock signal H1. In other words, the clock signal H1 may determine at which instances of time data are output from the state machine 510 to the output F, to be forwarded to the device-under-test. For example, data may be taken over from the state machine 510 to the output F in response to an edge of the clock signal H1, or in response to a predetermined, level of the clock signal H1. Similarly, data may be taken over from the input G to the state machine 510 in response to an edge of the clock signal H2, or in response to a predetermined level of the clock signal H2. Moreover, a clock signal H3 may determine a time at which the state machine 510 changes its state from a present state to a successor state.

One or more of the clock signals H1, H2, H3 may be provided to the field-programmable-gate-array 500 by the test processor. Thus, a programmable timing of the FPGA 500 may be obtained. In other words, the test processor may control an input timing and/or output timing via Hi (for example H1, and/or H2 and/or H3).

Figure 6A:
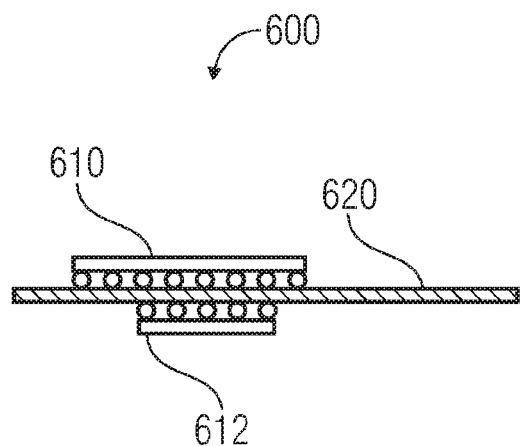
FIGS. 6a to 6c show schematic representations of possible physical configurations of a test processor and a field programmable gate array.

In the following, some possible physical configurations will be described taking reference to FIGS. 6a, 6b and 6c. FIG. 6a shows a schematic representation of a possible arrangement of a test processor and a field-programmable-gate-array. The arrangement shown in FIG. 6a is designated in its entirety with 600. As can be seen in FIG. 6a, a test processor 610 and a programmable logic device (for example a field-programmable-gate-array) 612 can be arranged on opposite sides of a printed circuit board (PC board) 620. For example, the test processor 610 may be attached to a top surface (or first surface) of the printed circuit board 620 using a ball-grid-array technology. Similarly the programmable logic device (for example FPGA) can be attached to a second surface of the printed circuit board 620, as shown in FIG. 6a. Accordingly, connections between the test processor 610a and the programmable logic device can be made very short.

Naturally, sizes shown in FIG. 6a are not necessarily to scale. In contrast, the programmable logic device may comprise a larger size than the test processor.

Figure 6B:
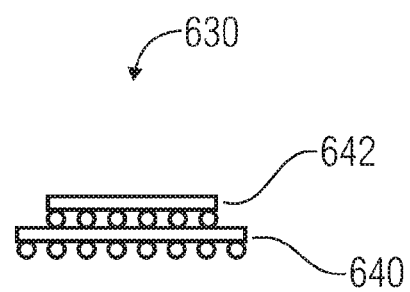

FIG. 6b shows a schematic representation of another physical configuration. The physical configuration shown in FIG. 6b is designated in its entirety with 630. The arrangement 630 comprises a test processor 640. A field-programmable-gate-array 642 is stacked on top of the test processor 640. For example, the field-programmable-gate-array 642 may be stacked on top of the test processor 640 using a ball-grid-array connection, as shown in FIG. 6b. The test processor 640 may further be configured to be attached to a printed circuit board using a bail-grid-array connection, as shown in FIG. 6b. Naturally, the test processor could also be stacked on top of the field-programmable-gate-array.

In some embodiments, a system-in-package concept (SiP) can optionally be used. For example, both the test processor and the programmable logic device (for example, field-programmable-gate-array) may be contained in a single, common package. Alternatively, a package-on-package concept (PoP) may be applied. In other words, a package comprising the test processor may be stacked on top of a package comprising the field-programmable-gate-array, or vice versa.

Figure 6C:
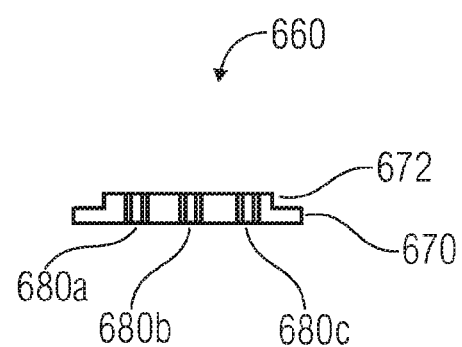

FIG. 6c shows a schematic representation of another physical configuration. The physical configuration shown in FIG. 6c is designated in its entirety with 660.

The configuration 660 comprises a test processor 670 and a field-programmable-gate-array 672. For example, the FPGA 672 is stacked onto the test processor 670 using a chip-on-chip technology (CoC). For example, through-silicon-vias 680a, 680b, 680c are used to connect a circuit of the test processor 670 with a circuit of the field-programmable-gate-array 1072.

It should be noted here chat naturally, other configurations and arrangements of the test processor and of the field-programmable-gate-array can be used.

Figure 7:
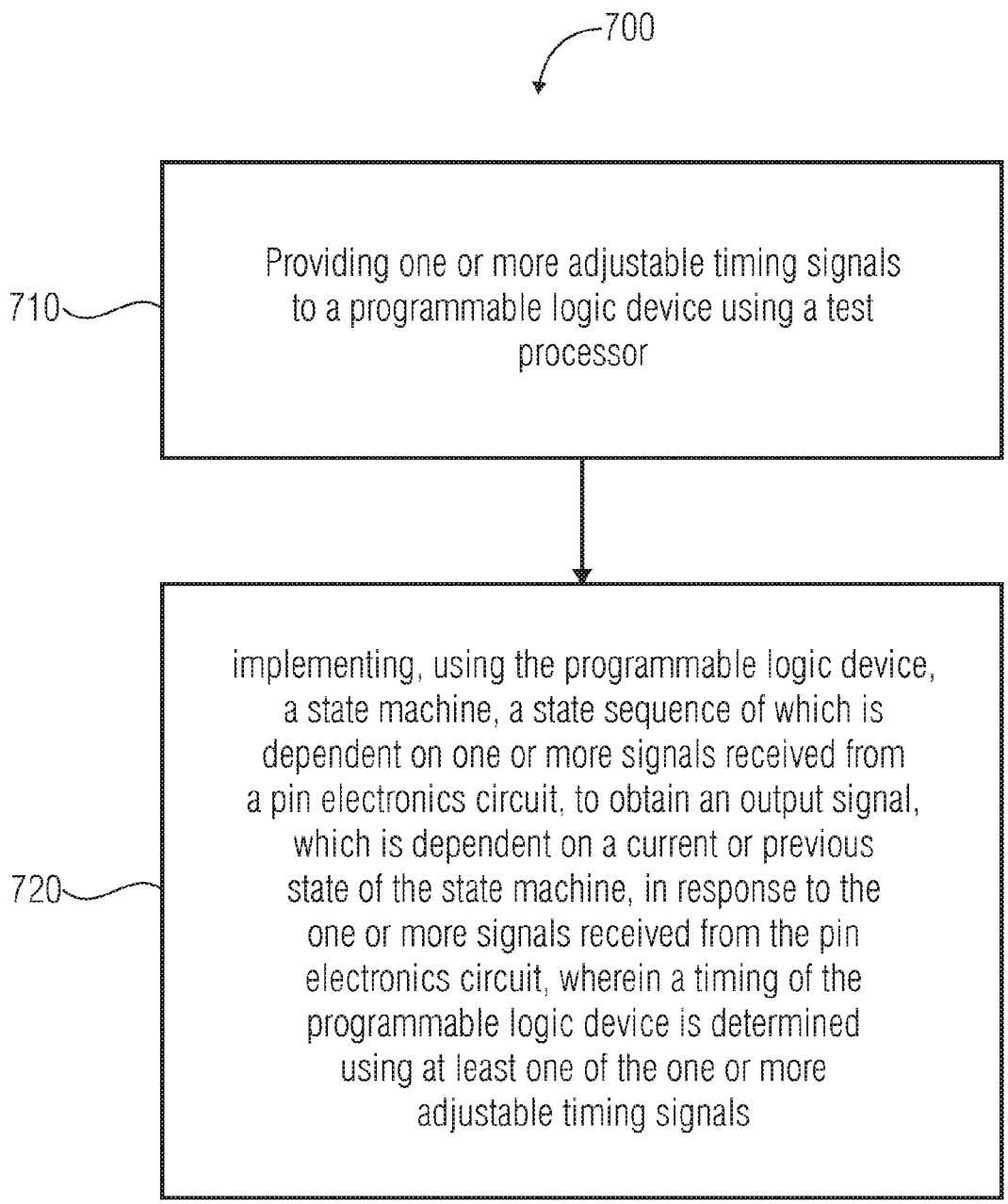
FIG. 7 shows a flow chart of a method for operating an automated test equipment, according to an embodiment according to the invention.

FIG. 7 shows a flow chart of a method for operating an automated test equipment. The method shown in FIG. 7 is designated in its entirety with 700. The method 700 comprises providing 710 one or more adjustable-timing signals to a programmable logic device using a test processor. The method 700 further comprises implementing 720, using the programmable logic device, a state machine, a state sequence of which is dependent on one or more signals received from a pin electronics circuit, to provide an output signal, which is dependent on a current or previous state of the state machine, in response to one or more signals received from the pin electronics circuit, wherein a timing of the programmable logic device is determined using at least one of the one or more adjustable-timing signals.

The method 700 can be extended by any of the aspect and functionalities disclosed herein, for example, in respect to the apparatus 100, 200, 300, 400.

Regarding the concept of using a programmable logic device, it should be noted, that such a programmable logic device, for example, a field-programmable-gate-array, or a so called "complex programmable logic device" (CPLD) is usually (but not necessarily) re-configurable. In other words, a configuration of the programmable logic device may, for example, be changed one time or multiple times, even at the runtime of the system in which the programmable logic device is used.

For example, in a test system, the programmable logic device, which may, for example, be arranged on a general module, may be configured. For example, configuration data may be uploaded into a configuration memory from a controller, for example, from a work station controlling the test system. The programmable logic device may then load the configuration from the configuration memory in order to establish its internal configuration (for example, to act as a state machine). Alternatively, a programmable logic device may be programmed using a so called standardized STAG interface. The STAG interface may, for example, be accessed by a work station controlling the test system, or by any other configuration means (for example, a dedicated configuration controller or a test processor) to define a configuration of the programmable logic device. Different methods of configuring a programmable logic device are typically described in the device specification of the respective programmable logic device, which device specification is usually provided by the device manufacturer (for example, Xilinx or Altera).

Figure 8:
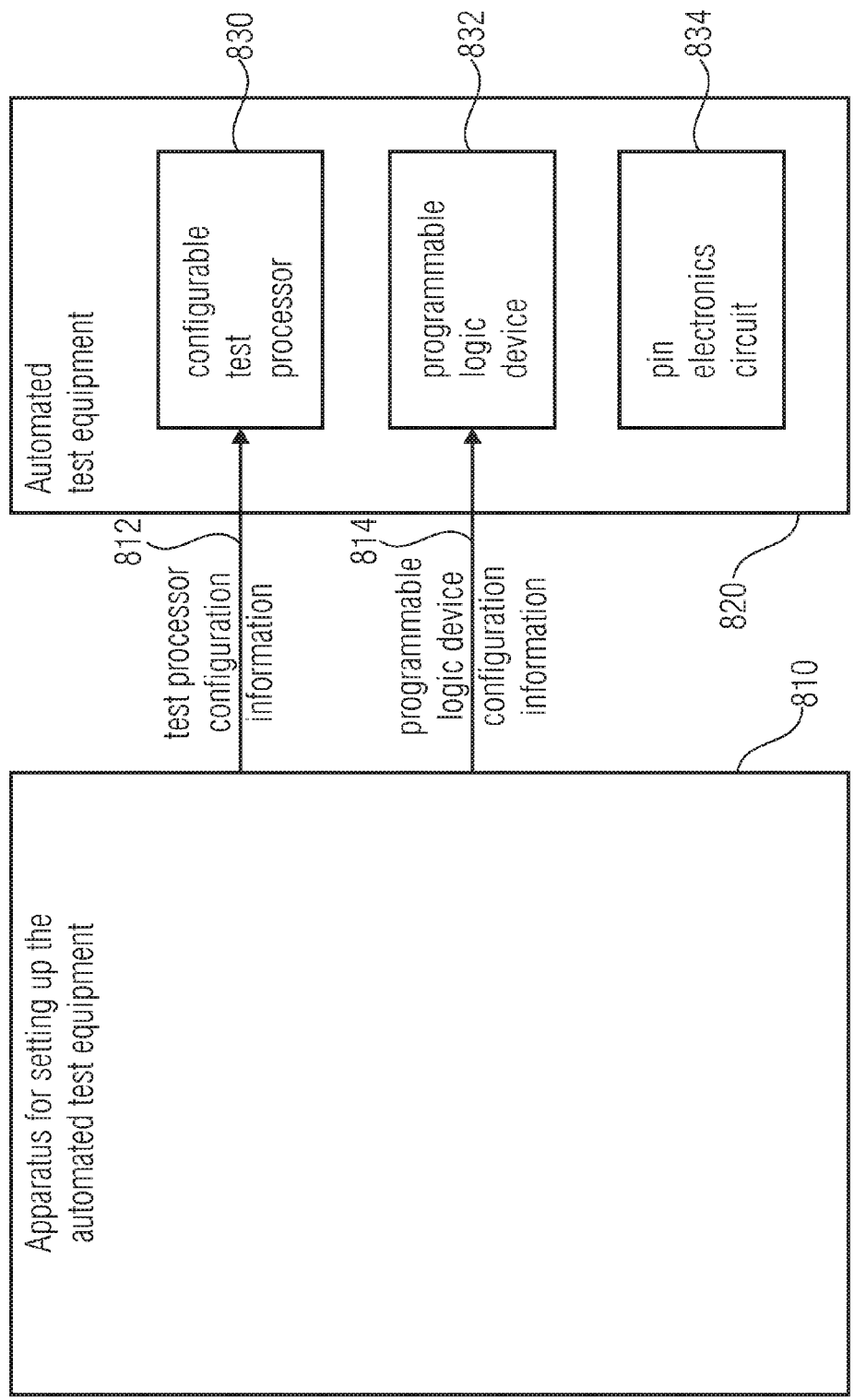
FIG. 8 shows a block schematic diagram of an apparatus for setting up an automated test equipment, according to an embodiment according to the invention.
Figure 10:
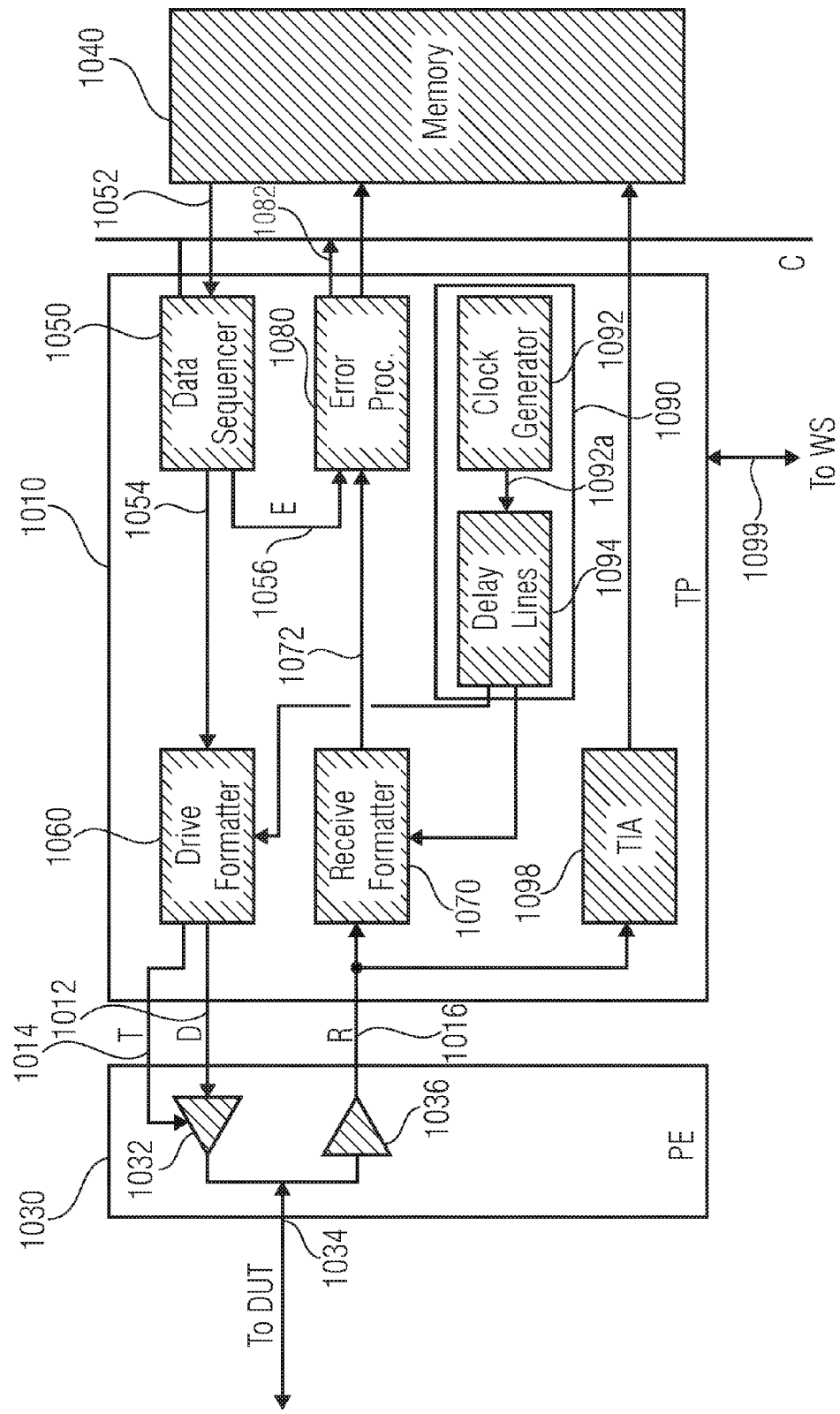
FIG. 10 shows a block schematic diagram of a conventional automated test equipment.

In the following, a cooperation between an automated test equipment and an apparatus for setting up the automated test equipment will be described taking reference to FIG. 8. FIG. 8 shows a block schematic diagram of a test system. The test system shown in FIG. 8 is designated in its entirety with 800. The to system 800 comprises an apparatus 810 for setting up the automated test equipment. The test system 800 further comprises the automated test equipment 820. The automated test equipment 820 comprises a configurable to processor 830, as described above, a programmable logic device 832, as described above, and a pin electronics circuit 834, as described above. The apparatus for setting up the automated test equipment may, for example, be configured to provide a test processor configuration information 812 to the automated test equipment 820. For example, the apparatus 810 may provide a representation of a test program into a memory 1040 connected to the test processor as shown in FIG. 10. Moreover, the apparatus for setting up the automated test equipment may be configured to provide a programmable-logic-device configuration-information 814 for configuring the programmable logic device 832. The configuration information 814 may, for example, be stored in a memory connected to the programmable logic device, or directly in the programmable logic device, depending on the requirements of the programmable logic device.

The apparatus 810 may be adapted to configure the automated test equipment 820 such that the automated test equipment 820 fulfills the functionality as described herein. In other words, the automated test equipment 820 may, in some embodiments, be shipped in an un-configured state. However, by coupling the automated test equipment 820 with the apparatus 810 for setting up the automated test equipment, and by activating the apparatus 810, the automated test equipment 820 may be configured (for example, by programming the configurable test processor, the programmable logic device, or corresponding memories) to have the functionality described herein.

Figure 9:
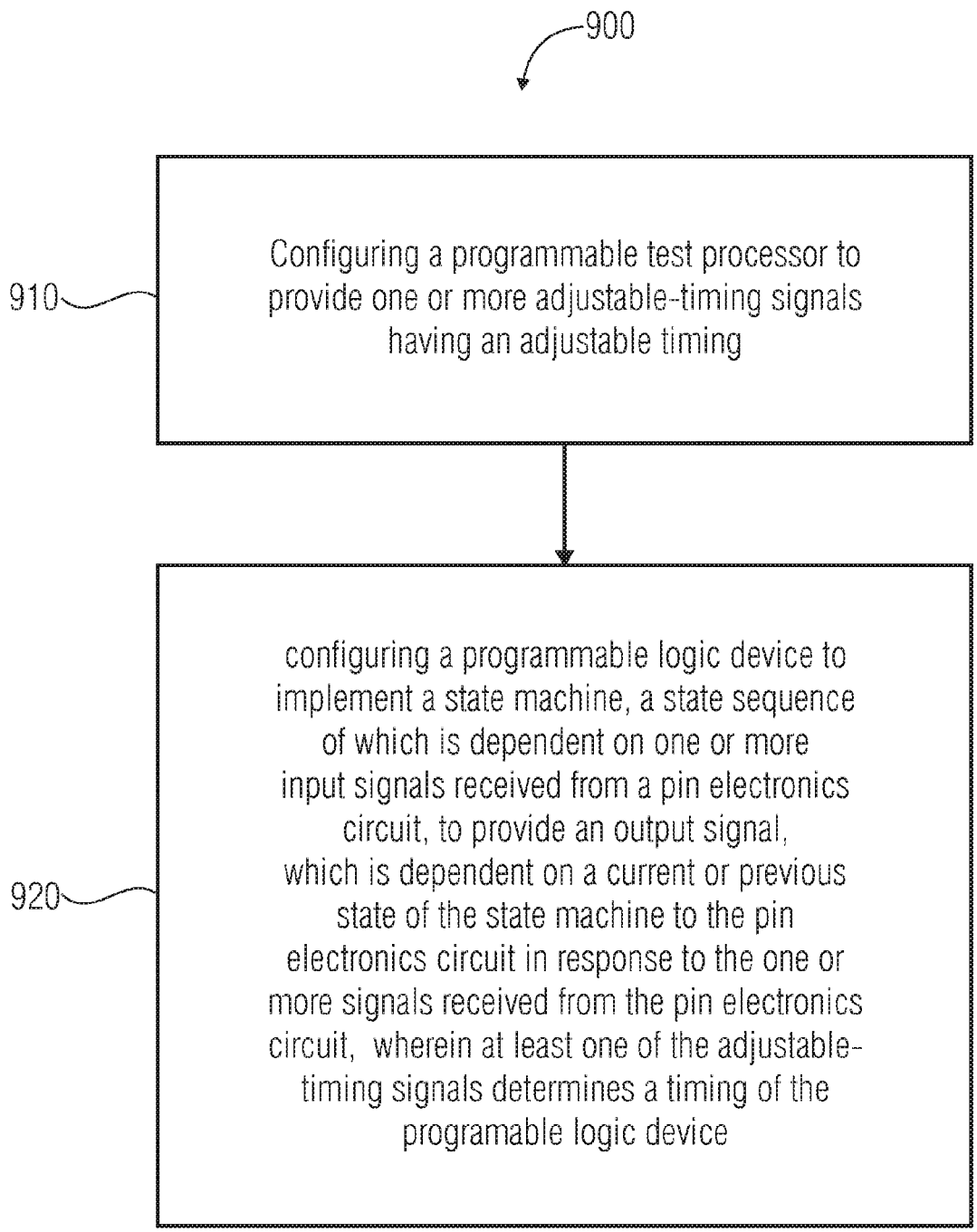
FIG. 9 shows a flow chart of a method for setting up an automated test equipment, according to an embodiment according to the invention.

FIG. 9 shows a flow chart of a method for setting up an automated test equipment. The method shown in FIG. 9 is designated in its entirety with 900. The method 900 comprises configuring 910 a programmable test processor of the automated test equipment to provide one or more adjustable timing signals having an adjustable timing. The method 900 further comprises configuring 920 a programmable logic device of the automated test system to implement a state machine, a state sequence of which is dependent on one or more input signals received from a pin electronics circuit, to provide an output signal, which output signal is dependent on a current or previous state of the state machine, to the pin electronics circuit in response to the one or more signals received from the pin electronics circuit, wherein at least one or more of the adjustable-timing signals determines a timing of the programmable logic device.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium) comprising the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein. Al A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein.

To summarize the above, some embodiments according to the invention overcome disadvantages of traditional automated test equipments, which output predetermined vectors (a set of states across pins) and compare an input to predetermined vectors. Regarding traditional automated test equipment, it should be noted that making a test deterministic may be very time consuming, often at the expense of coverage. In some traditional automated test equipments, this prevents using intelligence in the device because the automated test equipment cannot deal with non-determinism.

Some embodiments according to the invention facilitate a system level test. An automated test equipment, with the ability to emulate the protocol of the devices natural environment allows, more realistic testing and simplifies test development, because software for the final system can be leveraged.

Some embodiments according to the invention comprise the functionality to emulate a memory with programmable timing and levels. For example, the pin electronics circuit may provide adjustable signal levels. The programmable logic device may, for example, be programmed such that the programmable logic device emulates a functionality of a memory (for example of a DRAM chip or a DRAM module, or of another type of memory). According to some embodiments, a pattern based test can be performed, for example, using a conventional digital channel. For example, the pattern based test can be performed using solely the test processor. In other words, a pattern may be generated by the test processor (for example, by the data sequencer and the drive formatter thereof) and may be forwarded to the device-under-test (for example, a memory) in an unchanged form. In addition, a transaction level protocol emulation may be performed (memory contains intention and behavior). For example, the programmable logic device may be used to emulate the protocol of such memory, for example in cooperation with the test processor.

In the following, some possible specifications of a protocol-aware automated test equipment using a field-programmable-gate-array technology will, be described. However, it should be noted that the performance can vary significantly depending on the implementation.

In some embodiments, an input/output rate of 800 Mbit/s can be obtained. In some embodiments, a finite state machine can be clocked at a clock rate of about 200 MHz, but even further clocking is possible. In some embodiments, a protocol latency of 20 nsec or even less is achievable. In some embodiments, a cas latency (CL) of 8 is achievable. In some embodiments, a memory size of 1 MByte can be obtained. In some embodiments, 80 channels can be obtained.

In some embodiments, a DDR interface, a DDR-2 interface, a DDR-3 interface or a QDR-2 interface can be emulated. In some other embodiments, a DDR controller, a DDR-2 controller, a DDR-3 controller or a QDR-2 controller can be emulated. Thus, different types of memory interfaces and/or memory controllers can be emulated using the field-programmable-gate-array. Naturally, other types of memory interfaces or memory controllers can also be emulated, as the desired. In some embodiments, a Stratix-2 FPGA, a Stratix-3 FPGA, a Virtex-4 FPGA or a Virtex-5 FPGA can be used for the emulation of a memory interface or a controller intellectual property (controller IP). Naturally, an achievable performance is dependent on a performance of the used FPGA.

In some embodiments, a protocol latency, for example, a round trip time from a device-under-test back to the device-under-test may be determined by a pogo-cable, by the pin electronics, by a timing synchronization, and by a logic for obtaining a next state.

In some embodiments, a memory data latency may be caused by a protocol latency, by an address decoding, by a memory look-up and by a data path. Naturally, latency values may depend on implementation details.

In addition, a usable clock speed may depend on the performance of the FPGA.

In the following, some further aspects will be described. In some embodiments, the test processor (TP) may optionally comprise a combination of a sequencer, a formatter, a data capture, an error processing and a timing generation. For some details, reference is made to U.S. Ser. No. 11/435,064.

In some embodiments, one logical test processor can optionally be implemented in one or multiple physical chips. In some embodiments, one physical chip may contain one or multiple logical test processors.

In some embodiments, the pin electronics (PE) may optionally be configured to drive an output signal with a programmable level and to compare an input signal with a programmable level.

In some embodiments, a FPGA may generally represent a programmable logic or a re-configurable logic.

In the following, some further embodiments according to the invention will be described.

Figure 11:
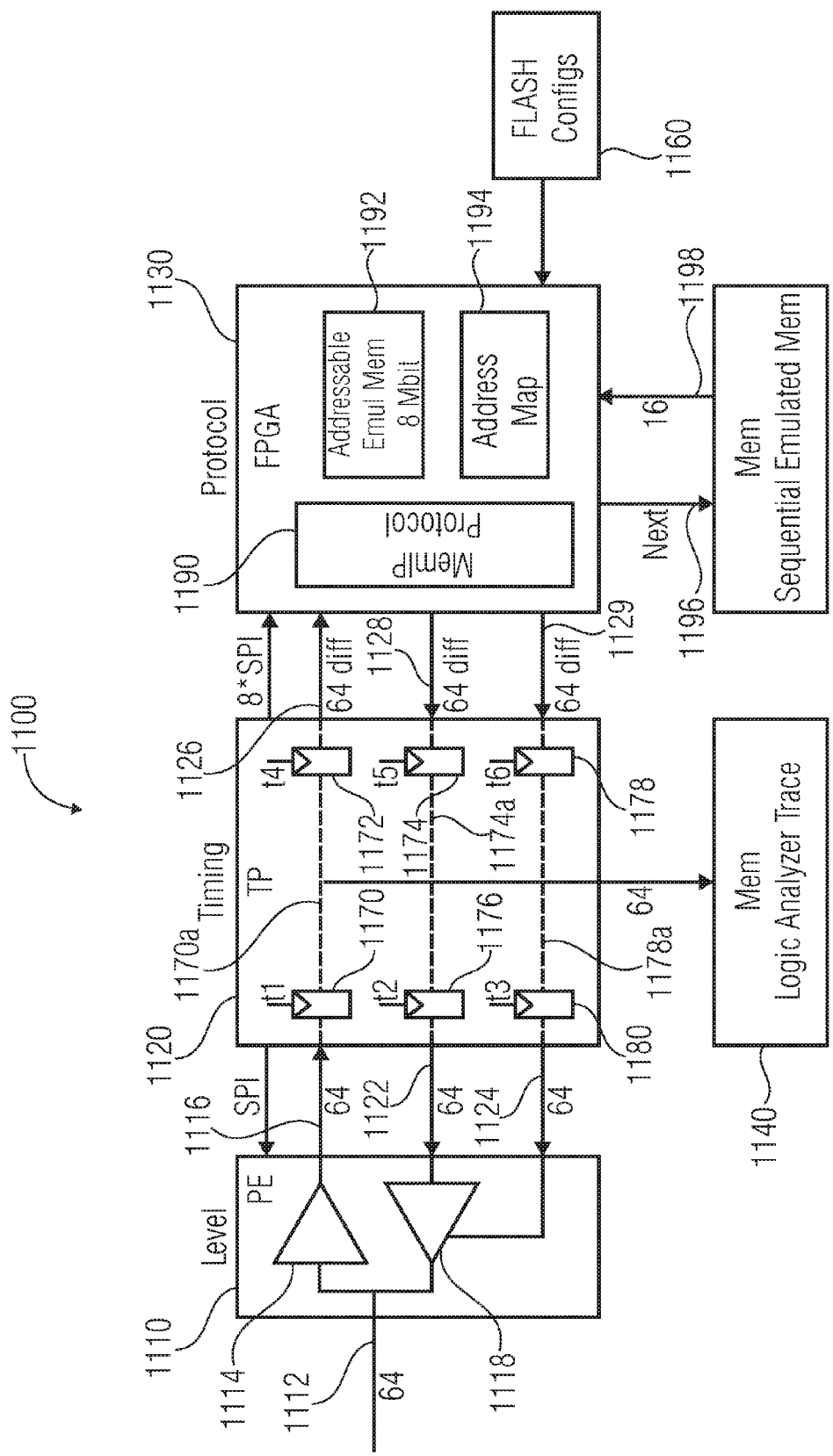
FIG. 11 shows a block schematic diagram of a re-configurable test circuit, according to another embodiment according to the invention.

FIG. 11 shows a block schematic diagram of a re-configurable test circuit, according to another embodiment according to the invention. The re-configurable test circuit shown in FIG. 11 is designated in its entirety with 1100. It should be noted here that FIG. 11 can be considered as a representation of an overall architecture.

The re-configurable test circuit 1100 comprises a level conversion circuit 1110, a timing circuit 1120 and the protocol circuit 1130. Furthermore, the re-configurable test circuit 1100 comprises a memory 1140 configured to provide a "logic analyzer trace" functionality. Further, the re-configurable test circuit 1100 comprises a memory 1150 configured to implement a "sequential emulated memory" functionality. Further, the re-configurable test circuit 1100 comprises a flash memory 1160 for storing configuration information.

In the following, further details will be explained.

In the embodiment shown in FIG. 11, the level conversion circuit 1110 comprises, for example, a plurality of pin electronics circuits. The pin electronics circuits are configured to provide an interface between a device-under-test connection 1112 of the re-configurable test circuit, and internal signal paths of the re-configurable test circuit 1100. For example, the device-under-test connection 1112 of the circuit 1100 may comprise, for example, 64 lines (or pairs of lines, for example, if differential signals are used).

The level conversion circuit 1110 may comprise a plurality of pin electronics circuits. For example, the level conversion circuit 1100 may comprise a plurality of input stages 1140, and may be configured to provide, using the input stages 1114, for example, 64 input signals 1116. Thus, the input signals 1116 may, for example, represent signals provided to the circuit 1100 via the device-under-test connection 1112. Furthermore, the level conversion circuit 1110 may comprise a plurality of output stages 1118, which may be configured to receive output signals 1122 from the timing circuit 1120. Further, the output stages 1118 may provide signals at the device-under-test connection 1112 in dependence on the output signals 1124. Furthermore, the output stages 1118 may be configured to receive output stage enable signals 1124 from the timing circuit 1120. The output stage enable signals 1121 may, for example, be used by the output stages 1118 to decide whether the output stages 1118 shall be placed in an enabled state or in a disabled state.

To summarize the above, the pin electronics circuit 1110 may be configured to provide input signals 1116 in dependence on signals which are present at the device-under-test connection 1112, and the level conversion circuit 1110 may further provide output signals at the device-under-test connection 1112 in dependence on the output signals 1122 and (optionally) corresponding output stage enable signals 1124.

Furthermore, parameters of the level conversion circuit 1110 may, for example, be adjusted, for example, using a communication over a SPI interface.

In the embodiment shown in FIG. 11, the timing circuit 1120 is circuited between the level conversion circuit 1110 and the protocol circuit 1130. In other words, the timing circuit 1120 is configured to provide protocol circuit input signals 1126 on the basis of the input signals 1116.

Further, the timing circuit 1120 is configured to receive from the protocol circuit 1130 protocol circuit data output signals 1128 and to provide the output signals 1122 on the basis of the protocol circuit data output signal 1128. Furthermore, the timing circuit 1120 is configured to receive protocol circuit driver activation signals 1129 from the protocol circuit 1130 and to provide the enable signals 1124 on the basis of the protocol circuit driver activation signals 1129.

A signal path for one of the signals 1116 provided by the level conversion circuit 1110 towards the protocol circuit 1130 may, for example, extend via one or more of the test processors of the timing circuit 1120. The signal path for the signal 1116 provided by the level conversion circuit 1110 may, for example, comprise one or more sample devices 1170, 1172, which sample devices 1170, 1172 may, for example, comprise latches or flip-flops. For example, one of the signals 1116 may be sampled by a sample device 1170 in order to obtain a sampled signal 1170a. Accordingly, the first sample device 1170 may determine a time at which the signal 1116 provided by the level conversion circuit 1110 is evaluated in order to obtain the sampled signal 1170. The sampled signal (which may be considered as a time-discrete signal) may be forwarded to the protocol circuit 1130, for example, via a second sample circuit 1172. The second sample circuit 1172 may, for example, comprise a latch or a flip-flop. The second sample circuit 1172 may be configured to adjust a timing of edges of the signal 1126 provided to the protocol circuit 1130.

The first latch 1170 may, for example, be operated with an adjustable-timing signal t1, wherein the adjustable-timing signal t1 can be used to determine a sample time for providing the sampled signal 1170a. Moreover, the second sampling circuit 1172 may be operated using an adjustable-timing signal t4. The adjustable-timing signal t4 may determine a time at which an edge or transition occurs on the signal 1126.

Moreover, it should be noted that the individual signals out of the plurality of signals 1116 may be sampled at different times, as individual sampling circuits 1170 may be provided for individual signals. Further, a plurality of sampled signals 1117 may naturally be obtained on the basis of the plurality of signals 1116 provided by the level conversion circuit 1110. The individual sampled signals 1170a may be forwarded to the protocol circuits 1130 using individual sample circuits 1170, which individual sample circuits 1172 may be adjusted individually with respect to the timing. Accordingly, a timing relationship between the signals 1126 can be adjusted with high accuracy.

Furthermore, a signal path for providing the signals 1122 on the basis of the protocol circuit data output signals 1128 may comprise sample circuits 1174, 1176. For example, one of the sample circuits 1174 may be configured to sample one of the signals 1128 provided by the protocol circuit 1130. Accordingly, a sampled signal (or samples) 1174a is obtained. The sampled signal or samples 1174a are forwarded to the sample circuit 1176 (for example, a latch or flip-flop). The sample circuit 1176 determines a time at which the sampled signal or samples 1174a are output to the level conversion circuit 1110 via one of the signals 1122. Again, multiple parallel paths extend from the protocol circuit 1130 to the level conversion circuit 1110.

A timing of the sample circuit 1174 is adjustable using an adjustable-timing signal t5, and a timing of the sample circuit 1176 is adjustable via an adjustable-timing signal t2. Accordingly, a timing for a forwarding of the signals 1128 from the protocol circuit 1130 to the level conversion circuit 1110 is adjustable in a very flexible way using the adjustable-timing signal t5 and t2.

Similarly, a timing of forwarding of the protocol circuit driver activation signals 1129 to the level conversion circuit 1110 is adjustable. For this purpose, one of the protocol circuit driver activation signals 1129 may be sampled using a sample circuit 1178. Accordingly, a sampled signal 1178a (comprising, for example, a sequence of samples) may be obtained. The sampled signal 1178a may be forwarded via the sampled circuit 1180, to obtain one of the signals 1124. The timing of the sampled circuit 1178 may be determined by an adjustable-timing signal t6, and a timing of the sample circuit 1180 may be determined by an adjustable-timing signal t3.

It should be noted here that the signals 1116, 1122, 1124, 1126, 1128, 1129 may comprise a plurality of signals. The individual signals may be processed individually, or in groups. In other words, the timing may, for example, be adjusted individually for each signal, or for a group of signals.

In the following, the protocol circuit will be briefly described. The protocol circuit 1130 may, for example, be configured to emulate a behavior of a memory. The behavior of the memory may, for example, be controlled by the signals 1126, which may, for example, represent address signals and/or control signals. The protocol circuit 1132 may output the protocol circuit data output signals 1128, such that the protocol circuit data output signals describe a response of an emulated memory, in response to the protocol circuit data input signals 1126 (which may represent a memory address information or a memory control information). The protocol circuit 1130 may comprise a memory interface protocol circuit 1190, which memory interface protocol circuit 1190 may be configured to implement the protocol behavior of an emulated memory. Moreover, the protocol circuit 1130 may comprise an addressable emulation memory 1192. The addressable emulation memory 1192 may, for example, comprise a memory capacity of 8 M bit. Further, the addressable emulation memory 1192 may be configured to co-operate with the memory interface protocol circuit 1190, to provide to the memory interface protocol circuit 1190 memory information in response to the protocol circuit data input signals 1126. Thus, the memory interface protocol circuit 1190 may output data, which is provided by the addressable emulation memory 1192 using the protocol circuit data output signals 1128.

The protocol circuit 1130 may further comprise an address map 1194, which address map 1194 is configured to decide whether the addressable emulation memory 1192 should be updated using the external memory 1150. For example, the protocol circuit 1130 may issue a "next" signal 1196 to the memory 1150 (which may be a "sequential emulated memory"). In response to the next signal 1196, the memory 1150 may provide further information 1198 to the addressable emulation memory 1192.

The protocol circuit 1130 can, for example, be implemented using a field-programmable-gate array (FPGA). In other words, some or all of the functionalities of the protocol circuits 1130 may be implemented using the FPGA.

Further, in some embodiments, one or more of the sampled signals 1170a, 1174a, 1178a may be analyzed using a memory 1140. For example, sample values of the sampled signals 1170*a*, 1174*a*, 1178*a* may be stored in the memory 1140. Alternatively, the sample values or the sampled signals 1170*a*, 1174*a*, 1178*a* may be compared with reference values. A deviation from the reference values may be recognized, as a potential or actual error condition in some embodiments.

In other words, a "logic analyzer trace" functionality may be performed using the memory 1140.

It should be noted that a signal processing path may, for example, extend from the level conversion circuit 1110 (signal 1116) through the timing circuit 1120 (signal 1126) to the protocol circuit 1130, through the protocol circuit 1130 (signal 1128 or signal 1129), through the timing circuit 1120 again (signal 1122 or signal 1124) and back to the level conversion circuit 1110.

To summarize the above, FIG. 11 shows an example of an overall architecture.

Optional aspects of the architecture can be summarized as follows:
Direct 'normal' pin electronics (PE) to test processor (TP) connection to obtain an accurate timing;
Test Processors adjust DUT timing relative to ATE Clock (X MHz);
Test Processors adjust skews to FPGA;
FPGA works at bit level with one clock (e.g. X/2 MHz, DDR);
1 or more FPGAs for multiple channels;
All channels are created equal (even the X/2 MHz DUT Clock is just another X Gbps signal);
Fully independent clocking and sequencer resources keep other ports alive.
Generic PA architecture.
Preload, upload and check of memory content using SPI or standard vectors;
Modes set through SPI of 'master' channel;
FLASH on board for FPGA image(s).

Figure 12:
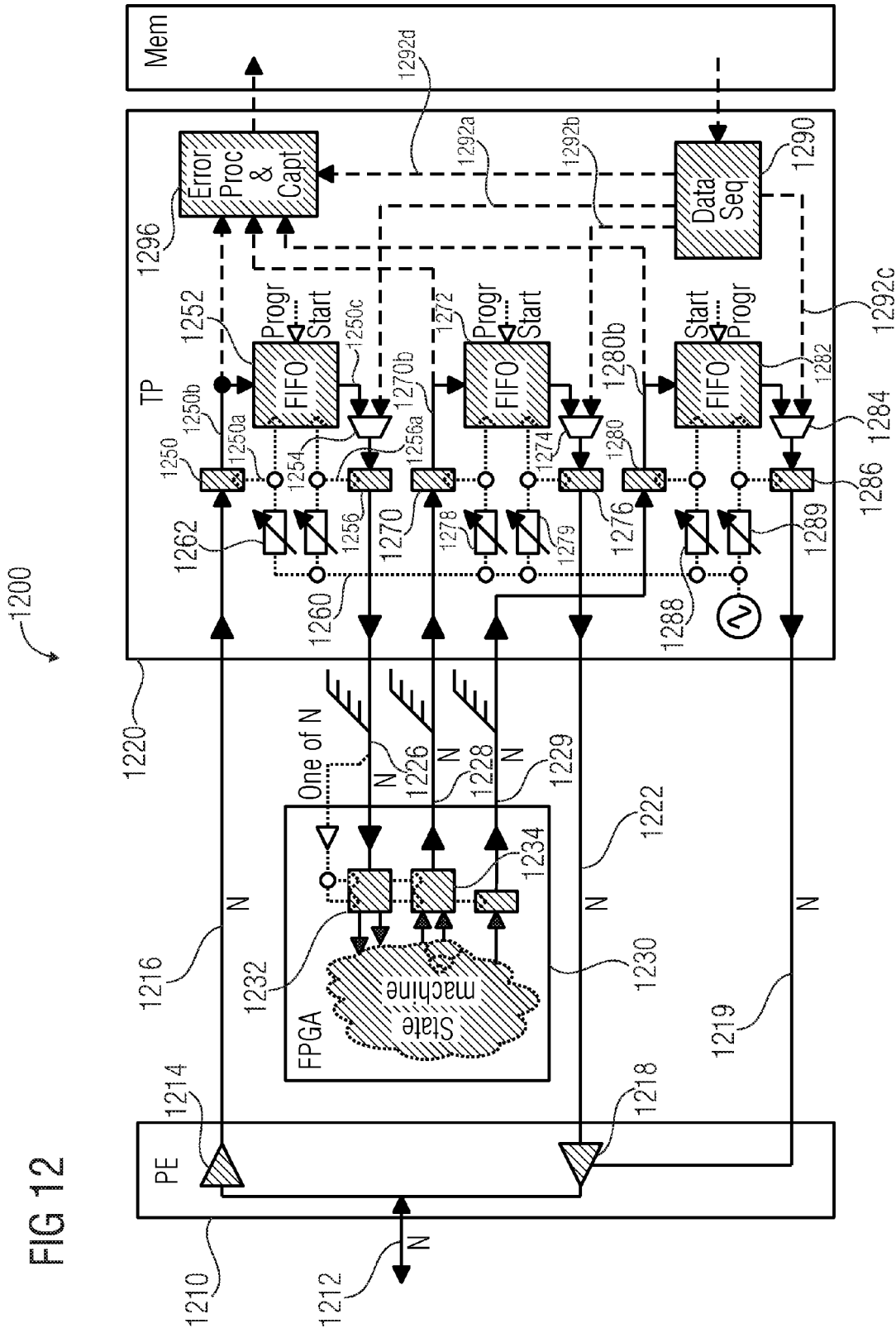
FIG. 12 shows a block schematic diagram of a re-configurable test circuit, according to another embodiment according to the invention.

In the following, details regarding a re-configurable test circuit will be described, taking reference to FIG. 12. FIG. 12 shows a block schematic diagram of a re-configurable test circuit according to another embodiment. Also, FIG. 12 shows a timing through the test processor (TP) and a logic in the FPGA. The re-configurable test circuit shown in FIG. 12 is designated in its entirety with 1200. The re-configurable test circuit 1200 comprises a pin electronics circuit 1210, which may, for example, comprise the functionality of the level conversion circuit 1110. The re-configurable test circuit 1200 may further comprise a test processor 1220, which may, for example, comprise the functionality of the timing circuit 1120. The re-configurable test circuit 1200 further comprises a field-programmable-gate-array 1230, which may, for example, comprise a functionality of the protocol circuits 1130.

The pin electronics circuit 1210 may be configured to couple the test processor 1220 to a device-under-test connection 1212. The device-under-test connection 1212 may, for example, comprise N-connections (for example, N lines, or differential pairs of lines). The pin electronics circuit 1210 may comprise one or more receivers 1214 (for example, N receivers 1214) to provide one or more input signals 1216 (for example, N-input signals 1216). Thus, the input signals 1216 may represent signals, which are present at the device-under-test connection 1212. The pin electronics circuit may further comprise one or more transmitters 1218 (for example, N transmitters 1218), which one or more transmitters are configured to provide a device-under-test signal to the device-under-test connection 1212 in response to one or more output signals 1222. The field-programmable-gate-array 1230 is configured to receive one or more FPGA data input signals 1226 (for example, N FPGA data input signals 1226) and to provide, on the basis thereof, one or more FPGA output signals 1228 (for example, N FPGA output signals 1228). Optionally, the FPGA may further be configured to provide one or more FPGA driver activation signals 1229, which may indicate whether a transmitter 1218 of the pin electronics circuit 1210 should be activated or deactivated (or enabled or disabled).

In the following, a forwarding of a signal 1216 to the test processor 1220 will be described, as well as a forwarding of the signal 1222 and a forwarding of the optional signal 1219. It should be noted that the forwarding will be described for a single signal here, for the sake of simplicity. However, identical structures may be used for the forwarding of more than a single signal.

The signal path within the test processor 1220 for forwarding one of the input signals 1216, to obtain the FPGA data input signal 1226, may comprise a first sample device 1250, a first-in-first-out memory (FIFO) 1252, a switch or multiplexer 1254 and another sample circuit 1256.

For example, the first sample circuit 1250 may be configured to receive the input signal 1216 provided by the pin electronics circuit 1210. The first sample circuit 1250 may comprise a latch or flip-flop. A timing of the first sample circuit 1250 may be adjusted using an adjustable-timing signal 1250*a*. Accordingly, the first sample circuit 1250 may provide a sampled signal 1250*b*, which is a sampled version of the input signal 1216 and wherein sample times are determined by the adjustable-timing signal 1250*a*. The FIFO 1252 may be configured to receive the sampled signal 1250*b*. The FIFO 1252 may be configured to store a plurality of samples of the sampled signal 1250*b* in a pipelined way. Accordingly, the FIFO 1252 may provide a delayed sampled signal 1250*c*, which is delayed with respect to the sampled signal 1253*b* by a plurality of FIFO clock cycles. A delayed sample signal 1250*c* is provided to an input of the switch or multiplexer 1254. The switch or multiplexer 1254 may, for example, be switchable to forward the delayed sampled signal 1250*c* to the data input of the second sample circuit 1256. A timing of the second sample circuit 1256 may be determined by an adjustable-timing signal 1256*a*. Accordingly, the second sample circuit 1256 may provide the output signal 1226, such that the output signal 1226 carries the information described by the sampled and delayed signal 1250*c*. However, a timing of edges or transitions of the FPGA data input signal 1226 may be determined by the adjustable-timing signal 1256*a*.

Optionally, the FIFO 1252 may also receive the adjustable-timing signal 1250*a* and the adjustable-timing signal 1256*a*.

The adjustable-timing signal 1250*a* may be derived from a master clock signal 1260 using an adjustable delay line 1262. Further, the adjustable timing signal 1256*a* may be derived, from the master clock signal 1260 using another adjustable delay line.

To summarize the above, a timing of the FPGA data input signal 1226 can be flexibly adjusted with respect to the input signal 1216 using the sample circuit 1250, the FIFO 1252, the sample circuit 1256 and the adjustable delay lines. Accordingly, a desired timing can be provided at the input of the FPGA 1230.

Similarly, the timing of the output signal 1222 can be adjusted with respect to a timing of the FPGA data output signal 1228 using circuitry of the test processor, for example, a sample circuit 1270, a FIFO 1272, a switch or a multiplexer 1274, and a sample circuit 1276. The functionality of the sample circuit 1270, the FIFO 1272, the switch or multiplexer 1274 and the sample circuit 1276 may be equivalent to the functionality of the circuits 1250, 1252, 1254, 1256.

Further, adjustable-timing signals may be provided to the sample circuits 1270, 1276, which may, for example, be provided by adjustable delay lines 1278, 1279 on the basis of the master clock signal 1260. Accordingly, a timing of the sample circuits 1270, 1276 is adjustable independent from a timing of the sample circuits 1250, 1256.

Further, a signal path for the optional FPGA driver activation signal 1229 may comprise a sample circuit 1280 (which may be equivalent to the sample circuit 1250), a FIFO 1282 (which may be equivalent to the FIFO 1252), a switch or a multiplexer 1284 (which may be equivalent to the switch or multiplexer 1254) and a sample circuit 1286 (which may be equivalent to the sample circuit 1256). The sample circuit 1286 may for example provide one or more driver activation signals, which can be used to activate or deactivate the driver 1218 of the electronic circuit 1210. The adjustable delay line 1288 may be configured to provide an adjustable-timing signal to a sampling circuit 1280, for example on the basis of the master clock signal 1260. Further, an adjustable delay line 1289 may be configured to provide an adjustable-timing signal to the sample circuit 1286, for example on the basis of the master clock signal 1260.

Again, the timing of the sample circuits 1280, 1286 may be adjustable independent from the timing of the sample circuits 1250, 1256, 1270, 1276.

Furthermore, the FIFOs 1252, 1272, 1282 may be programmed or initialized in response to a programming or initialization signal.

Further, the test processor 1230 may comprise a data sequencer 1290, which data sequencer 1290 may be equivalent to the data sequencer 1050 described with reference to FIG. 10. The data sequencer 1290 may, for example be configured to provide a data pattern signal 1292a to the switch or multiplexer 1254. Thus, in some embodiments the signal 1292a or a signal derived therefrom, can be provided to the FPGA 1230 as an FPGA data input signal 1226. Further, the data sequencer 1290 may, for example be configured to provide a data pattern signal 1292b to the switch or multiplexer 1274. Accordingly, the output signal 1222 can be provided on the basis of the data pattern signal 1292b provided by the data sequencer 1290, if the switch or multiplexer 1274 is switched accordingly. Thus, the output signal 1222 can be selectively provided in dependence on the FPGA data output signal 1228 or in dependence on data pattern signal 1292b. Similarly, the data sequencer 1290 may be configured to provide a data pattern signal 1292c to the switch or multiplexer 1284. Accordingly, the enable signal 1219 can be selectably provided in dependence on the FPGA driver activation signal 1229 or the data pattern signal 1292c.

Moreover, the test processor 1220 may further comprise an error processing and capture unit 1296 which may be equivalent to the error processing 1080 described with reference to FIG. 10. The data sequencer 1290 may be configured to provide a data pattern signal 1292d to the error processing and capture unit 1296. The data pattern signal 1292d may be equivalent to the signal 1056 described with reference to FIG. 10.

The error processing and capture unit 1292 may further be configured to receive the sampled signal 1250b and/or the sampled signal 1270b and/or the sampled signal 1280b. Thus, the error processing and capture unit 1296 may, for example compare the sampled signal 1250b, and/or the sampled signal 1270b and/or the sampled signal 1280b with the data pattern signal 1292d, to decide whether there is an error. In other words, the error processing and capture unit 1296 may be configured to evaluate one or more of the input signals 1216 and/or one or more of the FPGA data output signals 1228 and/or one or more of the FPGA driver activation output signals 1229. Accordingly, the error processing and capture may be able to monitor either a signal provided by the device-under-test (described by the one or more input signals 1216) or a signal provided in response thereto by the FPGA 1230. Alternatively, a combination of said signals may be evaluated by the error processing and capture unit 1296.

In the following, the functionality of the FPGA will be briefly described. The FPGA 1230 may be configured to implement a state machine, as described herein. For example, the FPGA may be used to implement a communication protocol, as described herein. However, one of the signals 1226 provided to the FPGA 1230 by the test processor 1220 may be used to determine a timing of an input latch or input flip-flop 1232 of the FPGA 1230 receiving the FPGA data input signals 1226. The same signal used to determine the timing of the input latch 1232 may, for example also be used to determine a timing of an output latch or output flip-flop 1234 providing the FPGA data output signal 1228.

However, alternatively different signals (for example, out of the signals 1226) may be used to determine a timing of the input latch or input flip-flop 1232 and of the output latch or output flip-flop 1234. For further details, reference also made to the above explanations with respect to FIG. 5. In an embodiment, the input latch or input flip-flop 1232 may be equivalent to the latch or flip-flop 520, and the output latch or output flip-flop 1234 may be equivalent to the latch or flip-flop 530.

The signal processing path may for example, extend from the pin electronics circuit 1210 to the test processor 1220 (signal 1216), through one or more timed forwarding units of the test processor (units 1250, 1252, 1256), to the FPGA 1230 (signal 1226), back to the test processor 1220 (signal 1228 or signal 1229), through one or more additional timed forwarding units of the test processor (units 1270, 1272, 1274 or units 1280, 1282, 1286) and back to the pin electronics circuit 1210 (signal 1222 or signal 1219).

Naturally, one or more of the timed forwarding units may be omitted in some embodiments.

Some variations can be made. For example, clocking in FPGA logic can be clocked with single edge or both edges. One FPGA can serve one or more test processors, or vice versa.

Figure 13:
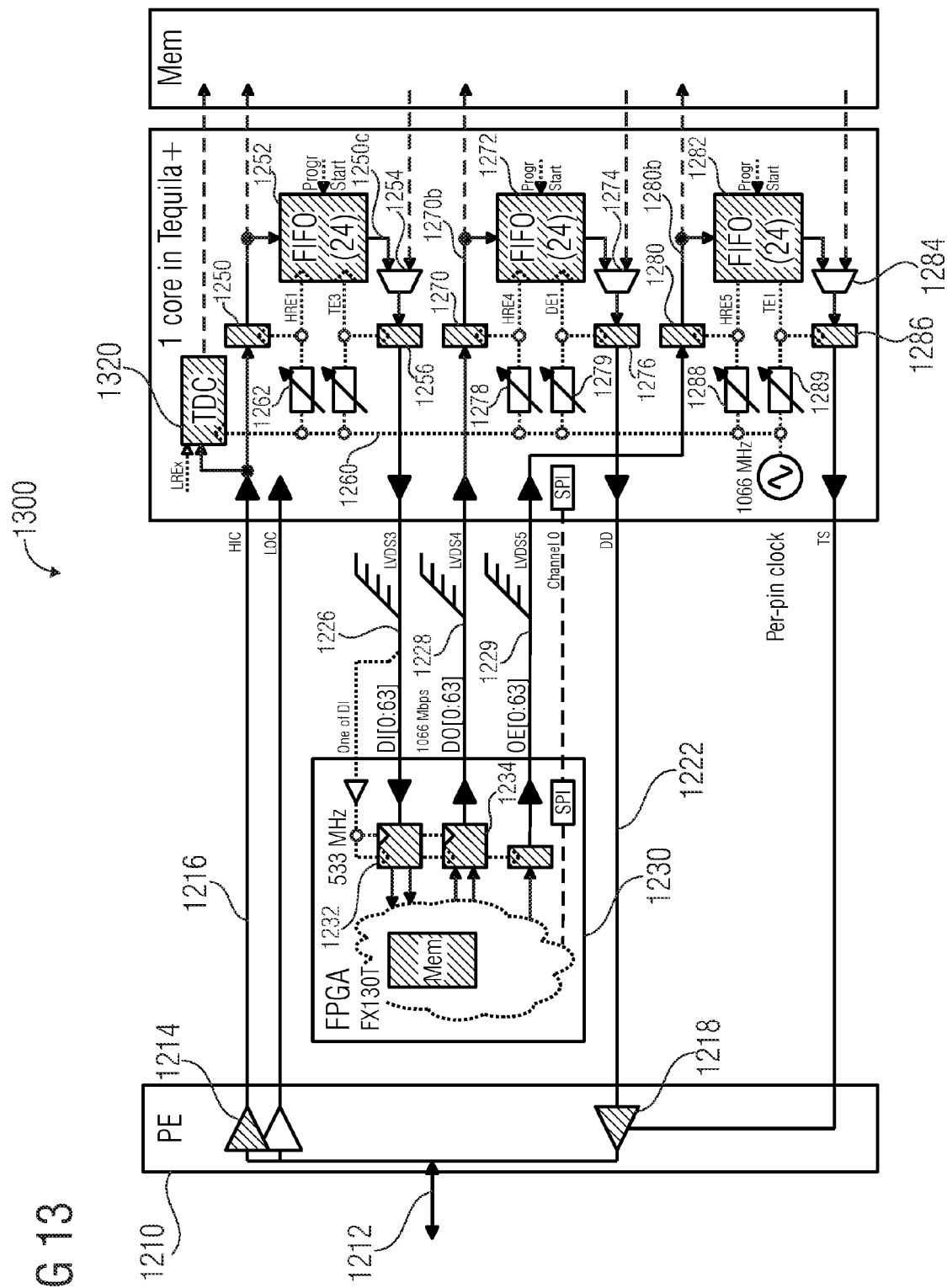
FIG. 13 shows a block schematic diagram of a re-configurable test circuit, according to another embodiment according to the invention.

In the following, some further details will be described taking reference to FIG. 13. FIG. 13 shows a block schematic diagram of a re-configurable test circuit, according to another embodiment of the invention. The architecture is shown. Also, a timing through the test processor (one channel) is shown. The re-configurable test circuit shown in FIG. 13 is designated in its entirety with 1300. The re-configurable test circuit 1300 is very similar to the re-configurable test circuit 1200, such that equivalent or identical means and signals are designated with identical reference numerals.

In addition to the circuit 1200, the circuit 1300 comprises a time-to-digital converter 1320, which is configured to determine a timing of a transition of one of the input signals 1216. Accordingly, the time-to-digital converter 1320 may provide a digital timing information, for example with reference to the master clock signal 1260.

Also, the master clock signal 1260 may, for example be a per-pin clock signal. The master clock signal may, for example, have a frequency of 1066 MHz. Further, a bit rate of the signals 1226, 1228 may, for example, comprise 1066 Mbit per second.

Figure 14:
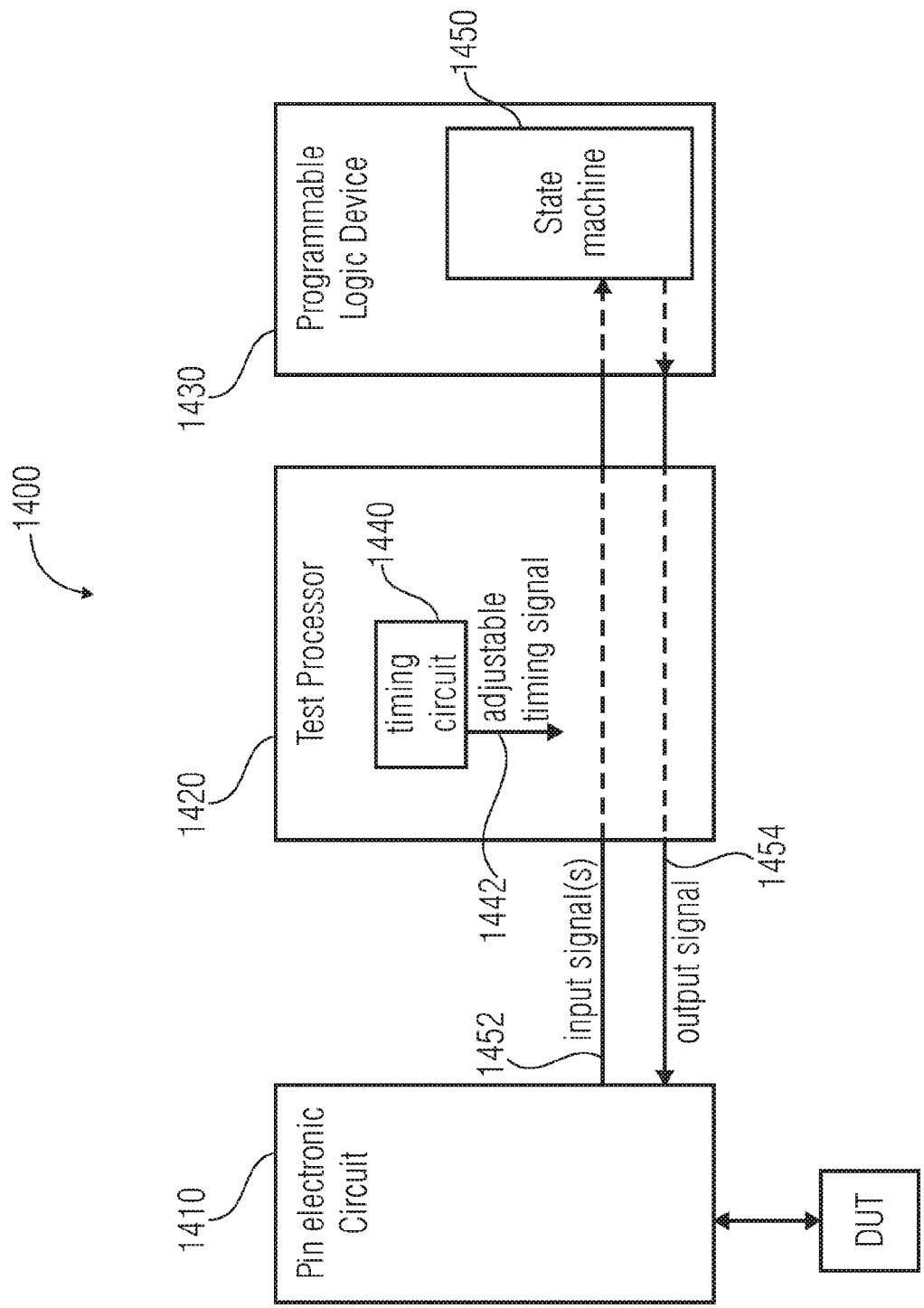
FIG. 14 shows a block schematic diagram of a re-configurable test circuit, according to another embodiment according to the invention.

In the following, another re-configurable test circuit according to an embodiment of the invention will be described taking reference to FIG. 14. The re-configurable test circuit for use in an automated test equipment shown in FIG. 14 is designated in its entirety with 1400. The re-configurable test circuit 1400 comprises a pin electronic circuit 1410 configured to provide an interface between the re-configurable test circuit and a device under test. The re-configurable test circuit 1400 further comprises a test processor 1420 and a programmable logic device 1430. The test processor 1420 comprises timing circuit 1440 configured to provide one or more adjustable timing signals 1442 having an adjustable timing.

The programmable logic device 1430 is configured to implement a stated machine 1450, a state sequence of which is dependent on one or more input signals 1452 received via the pin electronics circuit 1410. The re-configurable test circuit is configured to obtain, using the programmable logic device 1430, an output signal 1454, such that the output signal 1454 is dependent on a current or previous state of the state machine. The output signal 1454 is indicative of a signal to be output by the pin electronic circuit 1410 in response to the one or more input signals 1452 received from the pin electronics circuits 1410. Said test processor 1420 is coupled to the programmable logic device. The test processor is also configured to adjust, using the one or more adjustable-timing signals 1442, a timing used to generate the output signal 1454.

The test processor 1420 may be configured to sample one or more signals provided by the pin electronic circuit 1410 in response to the one or more adjustable-timing signals, to obtain the one or more input signals of the programmable logic device 1430. Alternatively, or in addition, the test processor may be configured to sample a signal provided by the programmable logic device in response to one of the adjustable-timing signals, to obtain the output signal.

Further, the test processor may be configured to sample a signal provided by the pin electronics circuit in response to one or more of the adjustable-timing signals, to obtain a sample of the input signal and to provide the sample of the input signal to the programmable logic device.

Optionally, the test processor comprises a first-in-first-out memory configured to buffer a plurality of samples of the signal provided by the pin electronic circuit prior to forwarding the samples to the programmable logic device.

The test processor may be configured to sample a signal provided by the pin electronic circuit in response to a first of the adjustable-timing signals, to obtain a sample of the input signal provided by pin electronics circuit, and to provide the sample of the input signal to the programmable logic device in response to a second of the adjustable timing signal. The test processor may be configured to adjust a timing relationship between the first of the adjustable-timing signals and the second of the adjustable-timing signals.

Optionally, the test processor may be configured to sample a data-out signal provided by the programmable logic device in response to one or more of the adjustable-timing signals, to obtain a sample of the data-out signal provided by the programmable logic device, and to provide the sample of the data-out signal as the output signal.

Optionally, the test processor may comprise a first-in-first-out memory configured, to buffer a plurality of samples of the data-out signal provided by the programmable logic device prior to forwarding the samples of the data-out signal provided by the programmable logic device as the output signal.

Further, the test processor may optionally be configured to sample a data-out signal provided by the programmable logic device in response to a first of the adjustable-timing signals, to obtain a sample of the data-out signal provided by the programmable logic device, and to provide the sample of the data-out signal provided by the programmable logic device, and to provide the sample of the data-out signal provided by the programmable logic device in response to a second of the adjustable-timing signals. The test processor may be configured to adjust a timing relationship between the first of the adjustable-timing signals and the second of the adjustable-timing signals. The test-circuit may further, optionally, comprise a first-in-first-out memory configured to buffer a plurality of samples of the signal provided by the programmable logic device prior to forwarding the samples to the pin electronic circuit.

Similarly, the programmable logic device may be configured to provide, using the state machine, a driver-activation signal indicating whether a driver of the pin electronics circuit should be activated or not. The test processor may be configured to sample the driver activation signal provided by the programmable logic device in response to one or more of the adjustable-timing signals, to obtain a sample of the driver-activation signal provided by the programmable logic device, and to provide the sample of the driver-activation signal to an enable input of the pin electronics circuit.

The test processor may comprise a first-in-first-out, memory configured to buffer a plurality of samples of the driver-activation signal provided by the programmable logic device prior to forwarding the samples of the driver-activation signal to enable or disable the input of the pin electronics circuit.

Optionally, the test processor may be configured to sample a driver activation signal provided by the programmable logic device in response to a first of the adjustable-timing signals, to obtain a sample of the driver having activation signal provided by the programmable logic device, and to provide the sample of the driver activation signal provided by the programmable logic device in response to a second of the adjustable timing signals. The test processor may be configured to adjust a timing relationship between the first of the adjustable timing signals and the second of the adjustable timing signals.

In an embodiment, the test processor may be circuited between the pin electronics circuit and the programmable logic device. The test processor may be configured to forward signals originating from the pin electronics circuit to the programmable logic device and to adjust a timing of the forwarding of signals originating from the pin electronics circuit to the programmable logic device. Alternatively, or in addition, the test processor may be configured to forward signals originating from the programmable logic device to the pin electronics circuit and to adjust a timing of the forwarding of signals originating from the programmable logic device to the pin electronics circuit.

The test processor may be configured no forward one or more signals from the pin electronics circuit to the programmable logic device and may also be configured to adjustably shift a timing of the one or more signals forwarded from the pin electronics circuit to the programmable logic device, for example when compared to another signal. Accordingly, different propagation delays may be compensated.

Optionally, the test processor may be configured to forward one or more signals from the programmable logic device to the pin electronics circuit. In this case, the test processor may be configured to adjustable shift a timing of the one or more signals forwarded from the programmable logic device to the pin electronics circuit. Again, propagation delay differences may be compensated.

While this invention has been described in terms of several embodiments, there are alterations, permutations, and equivalents which fail within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A re-configurable test circuit for use in an automated test equipment, the test circuit comprising:
a test processor; a programmable logic device; and
a pin electronics circuit configured to provide an interface between the re-configurable test circuit and a device-under-test;
wherein the test processor comprises a timing circuit configured to provide one or more adjustable-timing signals comprising an adjustable timing;
wherein the programmable logic device is configured to implement a state machine, a state sequence of which is dependent on one or more input signals received via the pin electronics circuit;
wherein the re-configurable test circuit is configured to acquire, using the programmable logic device, an output signal, which output signal is dependent on a current or previous state of the state machine, and which output signal is indicative of a signal to be output by the pin electronics circuit, in response to the one or more input signals received from the pin electronics circuit; and
wherein the test processor is coupled to the programmable logic device and wherein the test processor is configured to adjust, using the one or more adjustable-timing signals, a timing used in a signal processing path, wherein the signal processing path comprises a path through the programmable logic device to provide the output signal in dependence on the one or more input signals.

2. The re-configurable test circuit according to claim 1, wherein the test processor is configured to sample one or more signals provided by the pin electronics circuit in response to the one or more adjustable timing signals, to acquire the one or more input signals of the programmable logic device, or
wherein the test processor is configured to sample a signal provided by the programmable logic device in response to one of the adjustable-timing signals, to acquire the output signal.

3. The re-configurable test circuit according to claim 1, wherein the test processor is configured to sample a signal provided by the pin electronics circuit in response to one or more of the adjustable-timing signals, to acquire a sample of the input signal, and to provide the sample of the input signal to the programmable logic device.

4. The re-configurable test circuit according to claim 3, wherein the test processor comprises a first-in-first-out memory configured to buffer a plurality of samples of the signal provided by the pin electronics circuit prior to forwarding the samples to the programmable logic device.

5. The re-configurable test circuit according to claim 1, wherein the test processor is configured to sample a signal provided by the pin electronics circuit in response to a first of the adjustable-timing signals, to acquire a sample of the signal provided by the pin electronics circuit, and to provide the sample of the input signal to the programmable logic device in response to a second of the adjustable timing signals,
wherein the test processor is configured to adjust a timing relationship between the first of the adjustable-timing signals and the second of the adjustable-timing signals.

6. The re-configurable test circuit according to claim 1, wherein the test processor is configured to sample a data-out signal provided by the programmable logic device in response to one or more of the adjustable-timing signals, to acquire a sample of the data-out signal provided by the programmable logic device, and to provide the sample of the data-out signal as the output signal.

7. The re-configurable test circuit according to claim 6, wherein the test processor comprises a first-in-first-out memory configured to buffer a plurality of samples of the data-out signal provided by the programmable logic device prior to forwarding the samples of the data-out signal provided by the programmable logic device as the output signal.

8. The re-configurable test circuit according to claim 1, wherein the test processor is configured to sample a data-out signal provided by the programmable logic device in response to a first of the adjustable-timing signals, to acquire a sample of the data-out signal provided by the programmable logic device, and to provide the sample of the data-out signal provided by the programmable logic device in response to a second of the adjustable timing signals,
wherein the test processor is configured to adjust a timing relationship between the first of the adjustable-timing signals and the second of the adjustable-timing signals.

9. The re-configurable test circuit according to claim 1, wherein the test processor comprises a first-in-first-out memory configured to buffer a plurality of samples of the signal provided by the programmable logic device prior to forwarding the samples to the pin electronics circuit.

10. The re-configurable test-circuit according to claim 1, wherein the programmable logic device is configured to provide, using the state machine, a driver-activation signal indicating whether a driver of the pin electronics circuit should be activated or not, and
wherein the test processor is configured to sample the driver-activation signal provided by the programmable logic device in response to one or more of the adjustable-timing signals, to acquire a sample of the driver-activation signal provided by the programmable logic device, and to provide the sample of the driver-activation signal to an enable input of the pin electronics circuit.

11. The re-configurable test circuit according to claim 10, wherein the test processor comprises a first-in-first-out memory configured to buffer a plurality of samples of the driver-activation signal provided by the programmable logic device prior to forwarding the samples of the driver-activation signal provided by the programmable logic device to the enable input of the pin electronics circuit.

12. The re-configurable test circuit according to claim 1, wherein the test processor is configured to sample a driver activation signal provided by the programmable logic device in response to a first of the adjustable-timing signals, to acquire a sample of the driver-activation signal provided by the programmable logic device, and to provide the sample of the driver-activation signal provided by the programmable logic device in response to a second of the adjustable timing signals,
wherein the test processor is configured to adjust a timing relationship between the first of the adjustable-timing signals and the second of the adjustable-timing signals.

13. The re-configurable test circuit according to claim 1, wherein the test processor is circuited between the pin electronics circuit and the programmable logic device; and
wherein the test processor is configured to forward signals originating from the pin electronics circuit to the programmable logic device, and to adjust a timing of the forwarding of signals originating from the pin electronics circuit to the programmable logic device; or wherein the test processor is configured to forward signals originating from the programmable logic device to the pin electronics circuit, and to adjust a timing of the forwarding of signals originating from the programmable logic device to the pin electronics circuit.

14. The re-configurable test circuit according to claim 1, wherein the test processor is configured to forward one or more signals from the pin-electronics circuit to the programmable logic device, and wherein the test processor is configured to adjustably shift a timing of the one or more signals forwarded from the pin electronics circuit to the programmable logic device.

15. The re-configurable test circuit according to claim 1, wherein the test processor is configured to forward one or more signals from the programmable logic device to the pin electronics circuit, and wherein the test processor is configured to adjustably shift a timing of the one or more signals forwarded from the programmable logic device to the pin electronics circuit.

16. The re-configurable test circuit according to claim 1, wherein the test processor is coupled to the programmable logic device to provide at least one of the one or more adjustable-timing signals to the programmable logic device, to determine a timing of the programmable logic device.

17. The re-configurable test circuit according to claim 1, wherein the programmable logic device comprises a clocked circuit to provide the output signal on the basis of the one or more input signals received from the pin electronics circuit; and wherein the test processor is coupled to the programmable logic device to provide at least one of the one or more adjustable-timing signals to the programmable logic device, to determine a timing of the clocked circuit of the programmable logic device.

18. The re-configurable test circuit according to claim 16, wherein the programmable logic device comprises a clocked storage device configured to capture at least one of the one or more programmable logic device input signals received from the pin electronics circuit; and wherein one of the adjustable-timing signals is coupled to a clock input of the clocked storage device to allow for an adjustment of time instances at which the clocked storage device captures the programmable logic device input signal.

19. The re-configurable test circuit according to claim 16, wherein the programmable logic device comprises a clocked storage device configured to gate the programmable logic device output signal; and wherein one of the adjustable-timing signals is coupled to a clock input of the clocked storage device to allow for an adjustment of time instances at which the clocked storage device updates the programmable logic device output signal.

20. The re-configurable test circuit according to claim 16, wherein the state machine of the programmable logic device is a clocked state machine; wherein the state machine comprises one or more clocked storage elements; and wherein one of the adjustable-timing signals is coupled to the one or more clocked storage elements of the state machine, to allow for an adjustment of the timing of the clocked state machine.

21. The re-configurable test circuit according to claim 16, wherein the re-configurable test circuit is configured to forward at least one of the adjustable-timing signals both to the programmable logic device, to determine a timing of the programmable logic device, and to the pin electronics circuit to output the adjustable-timing signal to a device-under-test via the pin electronics circuit; or wherein the reconfigurable test circuit is switchable to selectably forward at least one of the adjustable-timing signals to the programmable logic device, to determine the timing of the programmable logic device, or to the pin electronics circuit, to output the adjustable-timing signal to a device-under-test via the pin electronics circuit.

22. The re-configurable test circuit according to claim 16, wherein the programmable logic device is coupled to a bit-stream-output of the test processor to receive the adjustable-timing signal; and wherein the test processor comprises a data sequencer configured to generate a bit stream comprising a programmable bit sequence at the bit stream output in dependence on a bit stream description describing the programmable sequence of bits of the bit stream.

23. The re-configurable test circuit according to claim 22, wherein the test processor further comprises a drive formatter configured to adjust a timing of edges of the bit stream at the bit stream output.

24. The re-configurable test circuit according to claim 16, wherein the programmable logic device is configured to receive the one or more adjustable-timing signals from a device-under-test bit-stream-output-channel of the test processor, wherein the device-under-test bit-stream-output-channel is adapted to provide a bit stream comprising a programmable bit sequence and a programmable timing.

25. The re-configurable test circuit according to claim 16, wherein the programmable logic device is configured to receive one or more adjustable-timing signals from a device-under-test bit-stream-output-channel of the test processor, to receive an instruction from the test processor to control a generation of the output signal provided to the pin electronics circuit.

26. The re-configurable test circuit according to claim 16, wherein the programmable logic device is configured to receive one or more adjustable-timing signals from a device-under-test bit-stream-output-channel of the test processor, to receive data from the test processor to control a generation of the output signal provided to the pin electronics circuit.

27. The re-configurable test circuit according to claim 16, wherein the programmable logic device is configured to provide a programmable logic device result signal in dependence on one or more of the input signals received from the pin electronics circuit or from the test processor; and wherein the test processor is configured to receive the programmable logic device result signal.

28. The re-configurable test circuit according to claim 27, wherein the test processor is configured to receive the programmable logic device result signal via a device-under-test bit-stream-input-channel; and wherein the device-under-test bit-stream-input-channel is adapted to compare the programmable logic device result signal with a programmable reference bit sequence.

29. The re-configurable test circuit according to claim 28, wherein the device-under-test bit-stream-input-channel comprises a receive formatter configured to determine a timing of the programmable logic device result signal.

30. The re-configurable test circuit according to claim 28, wherein the re-configurable test circuit is switchable to selectably couple the device-under-test bit-stream-input-channel of the test processor to the pin electronics circuit, to receive a device-under-test signal bypassing the programmable logic device, or to the programmable logic device, to receive the programmable logic device result signal.

31. The re-configurable test circuit according to claim 27, wherein the test processor is configured to trigger a capture of data in response to the programmable logic device result signal, or to stop a capture of data in response to the programmable logic device result signal.

32. The re-configurable test circuit according to claim 27, wherein the programmable logic device is configured to provide the programmable logic device result signal such that the programmable logic device result signal comprises a protocol information describing the communication protocol of the input signal received by the programmable logic device from the pin electronics circuit; and
wherein the test processor is configured to capture the protocol information, to react in response to the protocol information, or to analyze the protocol information.

33. The re-configurable test circuit according to claim 27, wherein the programmable logic device is configured to provide the programmable logic device result signal such that the programmable logic device result signal comprises a data information describing a data content of the input signal; and
wherein the test processor is configured to capture the data information, to react in response to the data information, or to analyze the data information.

34. The re-configurable test circuit according to claim 16, wherein the test processor is configured to receive the output signal provided to the pin electronics circuit by the programmable logic device, to capture said output signal, or to determine a timing of said output signal.

35. The re-configurable test circuit according to claim 16, wherein the re-configurable test circuit is configured to loop a programmable logic device output signal, output by the programmable logic device to the pin electronics circuit, back to an input of the test processor.

36. The re-configurable test circuit according to claim 16, wherein the test processor is configured to output a stimulus bit pattern to an input of the programmable logic device;
to receive a response signal, which is provided to the pin electronics circuit by the programmable logic device in response to the stimulus bit pattern; and
to determine a timing relationship between the stimulus bit pattern and the response signal.

37. The re-configurable test circuit according to claim 16, wherein the re-configurable test circuit is switchable to selectably operate
in a vector mode, in which vector mode the test processor is configured to generate a bit pattern and to provide the bit pattern to a bit pattern output, and in which vector mode the bit pattern output of the test processor is coupled to the pin electronics circuit, to output the generated bit pattern at a given terminal of a device-under-test connection of the pin electronics circuit, which device-under-test connection is connectable to a device-under-test; or
in a protocol mode, in which protocol mode an output of the programmable logic device is coupled to the pin electronics circuit, to output the programmable logic device output signal at the given terminal of the device-under-test connection of the pin electronics circuit.

38. The re-configurable test circuit according to claim 37, wherein the test processor and the programmable logic device are configured to exchange, when operating in the protocol mode, a timing information, a trigger information, a control information or a data information.

39. The re-configurable test circuit according to claim 16, wherein the programmable logic device is coupled to a plurality of test processor device-under-test channels, to receive a plurality of bit patterns from one or more device-under-test output channels or to provide a plurality of bit patterns to device-under-test input channels.

40. The re-configurable test circuit according to claim 1, wherein the programmable logic device is configured to emulate a communication protocol, to provide the output signal to the pin electronics circuit in response to the one or more input signals received from the pin electronics circuit in accordance with the communication protocol.

41. The re-configurable test circuit according to claim 1, wherein the programmable logic device is configured to emulate a behavior of a memory.

42. The re-configurable test circuit according to claim 1, wherein the programmable logic device is a complex programmable logic device or a field programmable gate array.

43. A method for operating an automated test equipment, the method comprising:
providing one or more adjustable-timing signals using a test processor;
implementing, using a programmable logic device, a state machine, a state sequence of which is dependent on one or more signals received via a pin electronics circuit, to acquire, using the programmable logic device, an output signal, which output signal is dependent on a current or previous state of the state machine, in response to the one or more signals received via the pin electronics circuit;
wherein a timing used in a signal processing, which signal processing is used to acquire the output signal, is adjusted in response to at least one of the one or more adjustable-timing signals.

44. The method according to claim 43, wherein the one or more adjustable timing signals are provided to the programmable logic device;
wherein the state sequence of the state machine is dependent on one or more signals received from the pin electronics circuit by the programmable logic device;
wherein the programmable logic device provides the output signal in response to the one or more signals received from the pin electronics circuit, such that the output signal is dependent on a current or previous state of the state machine; and
wherein the a timing of the programmable logic device is determined using at least one of the one or more adjustable-timing signals.

45. An apparatus for setting up an automated test equipment, the automated test equipment comprising a configurable test processor, a programmable logic device and a pin electronics circuit, the apparatus being adapted to:
configure the test processor to provide one or more adjustable-timing signals comprising an adjustable timing;
configure the programmable logic device to implement a state machine, a state sequence of which state machine is dependent on one or more input signals received via the pin electronics circuit,
to acquire, using the programmable logic device, an output signal to be output via the pin electronics circuit in response to the one or more signals received via the pin electronics circuit,
wherein the output signal is dependent on a current or previous state of the state machine; and
configure the automated test equipment, such that a timing used in a signal processing, which signal processing is used to acquire the output signal, is adjusted in response to at least one of the one or more adjustable-timing signals.

46. A method for setting up an automated test equipment, the automated test equipment comprising a configurable test processor, a programmable logic device and a pin electronics circuit, the method comprising:
configuring the programmable test processor to provide one or more adjustable-timing signals comprising an adjustable timing; and
configuring the programmable logic device to implement a state machine, a state sequence of which state machine is dependent on one or more input signals received via a pin electronics circuit
to acquire, using the programmable logic device, an output signal to be output via the pin electronics circuit in response to the one or more signals received via the pin electronics circuit,
wherein the output signal is dependent on a current or previous state of the state machine; and
wherein at least one of the adjustable-timing signals determines a timing used in a signal processing, which signal processing is used to generate the output signal.

47. A computer program for performing the method for operating an automated test equipment, the method comprising:
providing one or more adjustable-timing signals using a test processor;
implementing, using a programmable logic device, a state machine, a state sequence of which is dependent on one or more signals received via a pin electronics circuit, to acquire, using the programmable logic device, an output signal, which output signal is dependent on a current or previous state of the state machine, in response to the one or more signals received via the pin electronics circuit;
wherein a timing used in a signal processing, which signal processing is used to acquire the output signal, is adjusted in response to at least one of the one or more adjustable-timing signals,
when the computer program runs on a computer.

48. A computer program for performing the method according to claim 47, wherein the one or more adjustable timing signals are provided to the to the programmable logic device;
wherein the state sequence of the state machine is dependent on one or more signals received from the pin electronics circuit by the programmable logic device;
wherein the programmable logic device provides the output signal in response to the one or more signals received from the pin electronics circuit, such that the output signal is dependent on a current or previous state of the state machine; and
wherein the a timing of the programmable logic device is determined using at least one of the one or more adjustable-timing signals,
when the computer program runs on a computer.

49. A computer program for performing the method for setting up an automated test equipment, the automated test equipment comprising a configurable test processor, a programmable logic device and a pin electronics circuit, the method comprising:
configuring the programmable test processor to provide one or more adjustable-timing signals comprising an adjustable timing; and
configuring the programmable logic device to implement a state machine, a state sequence of which state machine is dependent on one or more input signals received via a pin electronics circuit
to acquire, using the programmable logic device, an output signal to be output via the pin electronics circuit in response to the one or more signals received via the pin electronics circuit,
wherein the output signal is dependent on a current or previous state of the state machine; and
wherein at least one of the adjustable-timing signals determines a timing used in a signal processing, which signal processing is used to generate the output signal,
when the computer program runs on a computer.

* * * * *